(12) United States Patent
Zhai et al.

(10) Patent No.: US 12,107,111 B2
(45) Date of Patent: Oct. 1, 2024

(54) INFRARED DETECTOR WITH MULTI-LAYER STRUCTURE BASED ON CMOS PROCESS

(71) Applicant: Beijing North Gaoye Technology Co., Ltd., Beijing (CN)

(72) Inventors: Guangjie Zhai, Beijing (CN); Pei Wu, Beijing (CN); Hui Pan, Beijing (CN); Guangqiang Zhai, Beijing (CN)

(73) Assignee: Beijing North Gaoye Technology Co., Ltd., Beijing (CN)

( * ) Notice: Subject to any disclaimer, the term of this patent is extended or adjusted under 35 U.S.C. 154(b) by 0 days.

(21) Appl. No.: 18/562,284

(22) PCT Filed: Mar. 24, 2022

(86) PCT No.: PCT/CN2022/082854
§ 371 (c)(1),
(2) Date: Nov. 17, 2023

(87) PCT Pub. No.: WO2022/267584
PCT Pub. Date: Dec. 29, 2022

(65) Prior Publication Data
US 2024/0243160 A1     Jul. 18, 2024

(30) Foreign Application Priority Data
Jun. 25, 2021   (CN) .......................... 202110711253.X

(51) Int. Cl.
*H01L 27/146*     (2006.01)
(52) U.S. Cl.
CPC .... *H01L 27/1465* (2013.01); *H01L 27/14629* (2013.01); *H01L 27/14636* (2013.01); *H01L 27/14689* (2013.01)

(58) Field of Classification Search
CPC .......... H01L 27/1465; H01L 27/14629; H01L 27/14636; H01L 27/14689
See application file for complete search history.

(56) References Cited

U.S. PATENT DOCUMENTS 6,690,014 B1 *   2/2004   Gooch .............. H01L 27/14649
                                                        438/96

FOREIGN PATENT DOCUMENTS

| CN | 101927976 A | 12/2010 |
| CN | 102983145 A | 3/2013 |

(Continued)

OTHER PUBLICATIONS

Skorka et al., "Design and Fabrication of Vertically-Integrated CMOS Image Sensors", Sensors, vol. 11, pp. 4512-4538. (Year: 2011).*

(Continued)

*Primary Examiner* — Kiho Kim
(74) *Attorney, Agent, or Firm* — Jaffery Watson Hamilton & DeSanctis LLP

(57) ABSTRACT

An infrared detector with a multi-layer structure based on a CMOS process. A CMOS measuring circuit system and a CMOS infrared sensing structure in the infrared detector are both fabricated by using the CMOS process, and a CMOS manufacturing process comprises a metal interconnection process, a through hole process, an IMD process and an RDL process. In the infrared detector with the multi-layer structure, a first columnar structure comprises at least one layer of solid columnar structure and/or at least one layer of hollow columnar structure, a second columnar structure comprises at least one layer of solid columnar structure and/or at least one layer of hollow columnar structure, at least one hole-shaped structure is formed in an absorption plate, and the hole-shaped structure at least penetrates a (Continued)

dielectric layer in the absorption plate; and/or, at least one hole-shaped structure is formed in a beam structure.

12 Claims, 11 Drawing Sheets

(56) References Cited

FOREIGN PATENT DOCUMENTS

| | | |
|---|---|---|
| CN | 203269550 U | 11/2013 |
| CN | 104792420 A | 7/2015 |
| CN | 106352989 A | 1/2017 |
| CN | 108225576 A | 6/2018 |
| CN | 108917942 A | 11/2018 |
| CN | 109256401 A | 1/2019 |
| CN | 110006538 A | 7/2019 |
| CN | 111525023 A | 8/2020 |
| CN | 113432725 A | 9/2021 |
| WO | WO-2014085699 A1 * | 6/2014 ............ A62B 18/02 |
| WO | 2020242384 A1 | 12/2020 |

OTHER PUBLICATIONS

Ning Shen "Research on microbolometer based on standard CMOS technology," China Doctoral Dissertation Full Text Database (Electronic Journal) Information Technology Series, Mar. 15, 2017, English Abstract, 2 pages, No. 3, ISSN: 1674-022X.

International Searching Authority (ISA)/CN, International Search Report for PCT/CN2022/082854, mailed Jun. 1, 2022, 5 pages.

International Searching Authority (ISA)/CN, Written Opinion for PCT/CN2022/082854, mailed Jun. 1, 2022, 5 pages.

Ning Shen "Research on microbolometer based on standard CMOS technology," China Doctoral Dissertation Full Text Database (Electronic Journal) Information Technology Series, Mar. 15, 2017, pp. 16-64, 80-96, No. 3, ISSN: 1674-022X.

* cited by examiner

INFRARED DETECTOR WITH MULTI-LAYER STRUCTURE BASED ON CMOS PROCESS

CROSS-REFERENCES TO RELATED APPLICATIONS

The present application is a national stage application of International Application PCT/CN22/82854, filed on Mar. 24, 2022, which claims priority to Chinese Patent Application No. 202110711253.X, entitled "INFRARED DETECTOR WITH MULTI-LAYER STRUCTURE BASED ON CMOS PROCESS," filed on Jun. 25, 2021, to China National Intellectual Property Administration, the entire contents of which are incorporated herein by reference.

TECHNICAL FIELD

The present disclosure relates to the technical field of infrared detection, in particular to an infrared detector with a multi-layer structure based on a CMOS process.

BACKGROUND

Monitoring market, automobile auxiliary market, household market, intelligent manufacturing market, mobile phone application and other fields all have a strong demand for uncooled high-performance chips, and have certain requirements for chip performances, performance consistency and product prices. It is estimated that there are more than 100 million chips in potential demand every year, but the current process solution and architecture cannot meet the market demand.

At present, an infrared detector adopts the combination of a measuring circuit and an infrared sensing structure. The measuring circuit is fabricated by a Complementary Metal-Oxide-Semiconductor (CMOS) process, while the infrared sensing structure is fabricated by a Micro-Electro-Mechanical System (MEMS) process, which lead to the following problems:
  (1) The infrared sensing structure is made by the MEMS process, with polyimide as a sacrificial layer, which is incompatible with the CMOS process.
  (2) Using the polyimide as the sacrificial layer has a problem that the release of polyimide is not complete, which affects a vacuum degree of the detector chip, and also limits a subsequent film growth temperature, which is not conducive to the selection of materials.
  (3) The polyimide may cause a height of a resonator to be inconsistent, which is difficult to ensure a main wavelength.
  (4) The control of the MEMS process is far worse than that of the CMOS process, which restricts the performance consistency and detection performance of the chip.
  (5) The MEMS has low productivity, low yield and high cost, and cannot realize mass production.
  (6) The existing process capability of the MEMS is not enough to support the preparation of higher-performance detectors, and a smaller line width and a thinner film thickness are not conducive to the miniaturization of chips.

SUMMARY (I) Technical Problem to be Solved

The technical problem to be solved by the present disclosure is how to overcome problems of process incompatibility and influence on performances of an infrared detector caused by the fact that a measuring circuit is made by adopting a CMOS process and an infrared sensing structure is fabricated by adopting an MEMS process.

(II) Technical Solutions

In order to solve the above-mentioned technical problems, the present disclosure provides an infrared detector with a multi-layer structure based on a CMOS process, including:
  a CMOS measuring circuit system and a CMOS infrared sensing structure, wherein both the CMOS measuring circuit system and the CMOS infrared sensing structure are fabricated by using the CMOS process, and the CMOS infrared sensing structure is directly fabricated on the CMOS measuring circuit system;
  at least one sealed release isolation layer is arranged above the CMOS measuring circuit system, and the sealed release isolation layer is configured to protect the CMOS measuring circuit system from process influence in a release etching course of manufacturing the CMOS infrared sensing structure.

The CMOS manufacturing process of the CMOS infrared sensing structure includes a metal interconnection process, a through hole process, an IMD process and an RDL process, the CMOS infrared sensing structure includes at least three metal interconnection layers, at least three dielectric layers and a plurality of interconnection through holes, the metal interconnection layer includes at least a reflecting layer and two electrode layers, and the dielectric layer includes at least two sacrificial layers and a heat-sensitive dielectric layer; wherein, the heat-sensitive dielectric layer is configured to convert a temperature change corresponding to infrared radiation absorbed by the heat-sensitive dielectric layer into a resistance change, and then convert an infrared target signal into a signal which is electrically readable through the CMOS measuring circuit system;

The CMOS infrared sensing structure includes a resonant cavity composed of the reflecting layer and the heat-sensitive dielectric layer and a suspended micro-bridge structure for controlling heat transfer, the suspended micro-bridge structure includes at least one layer of beam structure and at least one layer of absorption plate, the beam structure is located at one side of the absorption plate close to or away from the CMOS measuring circuit system, a first columnar structure is provided between the reflecting layer and the beam structure, and the first columnar structure is directly electrically connected to a support base in the reflecting layer and the corresponding beam structure, the beam structure is electrically connected to the CMOS measuring circuit system through the first columnar structure and the support base, a second columnar structure is provided between the absorption plate and the beam structure, and the second columnar structure is directly electrically connected to the corresponding absorption plate and the corresponding beam structure, and the absorption plate is configured to convert an infrared signal into an electrical signal and electrically connect to the corresponding first columnar structure through the second columnar structure and the corresponding beam structure.

The first columnar structure includes at least one layer of solid columnar structure and/or at least one layer of hollow columnar structure. The second columnar structure includes at least one layer of solid columnar structure and/or at least one layer of hollow columnar structure.

At least one hole-shaped structure is formed in the absorption plate, and the hole-shaped structure at least penetrates through a dielectric layer in the absorption plate; and/or, at least one hole-shaped structure is formed in the beam structure.

The CMOS measuring circuit system is configured to measure and process a value of an array resistor formed by one or more CMOS infrared sensing structures, and convert the infrared signal into an image electrical signal. The CMOS measuring circuit system includes a bias generation circuit, a column-level analog front-end circuit, and a row-level circuit. An input end of the bias generation circuit is connected to an output end of the row-level circuit. An input end of the column-level analog front-end circuit is connected to an output end of the bias generation circuit. The row-level circuit includes a row-level mirror pixel and a row selection switch. The column-level analog front-end circuit includes a blind pixel; wherein, the row-level circuit is distributed in each pixel and selects a to-be-processed signal according to a row strobe signal of a time sequence generation circuit, and outputs a current signal to the column-level analog front-end circuit to perform current and voltage conversion output under the action of the bias generation circuit.

The row-level circuit outputs a third bias voltage to the bias generation circuit when the row-level circuit is strobed by the control of the row selection switch. The bias generation circuit outputs a first bias voltage and a second bias voltage according to an input constant voltage and the third bias voltage, the column-level analog front-end circuit obtains two paths of currents according to the first bias voltage and the second bias voltage and performs transimpedance amplification on a difference between the generated two paths of currents and outputs the difference as an output voltage.

Optionally, the CMOS infrared sensing structure is fabricated in an upper layer or in the same layer of the metal interconnection layer of the CMOS measuring circuit system.

Optionally, the sacrificial layer is configured to enable the CMOS infrared sensing structure to form a hollow structure, a material forming the sacrificial layer is silicon oxide, and the sacrificial layer is corroded by using a post-CMOS process.

Optionally, the reflecting layer is configured to reflect the infrared signal and form the resonant cavity with the heat-sensitive dielectric layer. The reflecting layer includes at least one metal interconnection layer. The first columnar structure connects the corresponding beam structure and the CMOS measuring circuit system by using the metal interconnection process and the through-hole process, and the second columnar structure connects the corresponding absorption plate and the corresponding beam structure by using the metal interconnection process and the through hole process.

The beam structure includes a first electrode layer, or the beam structure includes a first dielectric layer and a first electrode layer, or the beam structure includes a first electrode layer and a second dielectric layer, or the beam structure includes a first electrode layer and a first heat-sensitive dielectric layer, or the beam structure includes a first dielectric layer, a first electrode layer and a second dielectric layer, or the beam structure includes a first dielectric layer, a first electrode layer and a first heat-sensitive dielectric layer, or the beam structure includes a first electrode layer, a first heat-sensitive dielectric layer and a second dielectric layer, or the beam structure includes a first dielectric layer, a first electrode layer, a first heat-sensitive dielectric layer and a second dielectric layer, and the absorption plate includes a second electrode layer and a second heat-sensitive dielectric layer, or the absorption plate includes a third dielectric layer, a second electrode layer and a second heat-sensitive dielectric layer, or the absorption plate includes a second electrode layer, a second heat-sensitive dielectric layer and a fourth dielectric layer, or the absorption plate includes a third dielectric layer, a second electrode layer, a second heat-sensitive dielectric layer and a fourth dielectric layer; wherein, a material forming the first dielectric layer includes at least one of amorphous silicon, amorphous germanium, amorphous germanium-silicon, aluminum oxide or amorphous carbon, a material forming the second dielectric layer includes at least one of amorphous silicon, amorphous germanium, amorphous germanium-silicon, aluminum oxide or amorphous carbon, a material forming the third dielectric layer includes at least one of amorphous silicon, amorphous germanium, amorphous germanium-silicon, aluminum oxide or amorphous carbon, a material forming the fourth dielectric layer includes at least one of amorphous silicon, amorphous germanium, amorphous germanium-silicon, aluminum oxide or amorphous carbon, a material forming the first heat-sensitive dielectric layer includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum, and a material forming the second heat-sensitive dielectric layer includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum; wherein, a material forming the first dielectric layer includes at least one of amorphous silicon, amorphous germanium, amorphous germanium-silicon, aluminum oxide or amorphous carbon, a material forming the second dielectric layer includes at least one of amorphous silicon, amorphous germanium, amorphous germanium-silicon, aluminum oxide or amorphous carbon, a material forming the third dielectric layer includes at least one of amorphous silicon, amorphous germanium, amorphous germanium-silicon, aluminum oxide or amorphous carbon, a material forming the fourth dielectric layer includes at least one of amorphous silicon, amorphous germanium, amorphous germanium-silicon, aluminum oxide or amorphous carbon, a material forming the first heat-sensitive dielectric layer includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum, and a material forming the second heat-sensitive dielectric layer includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum.

The beam structure includes a first dielectric layer, a first electrode layer, and a second dielectric layer. The absorption plate includes a third dielectric layer and a second electrode layer. The absorption plate includes a second electrode layer and a fourth dielectric layer, or the absorption plate includes a third dielectric layer, a second electrode layer, and a fourth dielectric layer, or the absorption plate includes a support layer, a third dielectric layer, a second electrode layer, and a fourth dielectric layer, or the absorption plate includes a third dielectric layer, a second electrode layer, a fourth dielectric layer and a passivating layer, or the absorption plate includes a support layer, a third dielectric layer, a second electrode layer, a fourth dielectric layer, and a passivating layer, wherein a material forming the first dielectric layer includes at least one of materials with a temperature coefficient of resistance larger than a set value, which are fabricated from amorphous silicon, amorphous germanium, amorphous germanium-silicon, or amorphous carbon. A material forming the second dielectric layer includes at least one of materials with a temperature coefficient of resistance larger than a set value, which are fabricated from amorphous silicon, amorphous germanium, amorphous germanium-silicon, or amorphous carbon, a material forming the third dielectric layer includes at least one of materials with temperature coefficient of resistance larger than a set value, which are fabricated from amorphous silicon, amorphous germanium, amorphous germanium-silicon, or amorphous carbon. A material forming the fourth dielectric layer includes at least one of materials with a temperature coefficient of resistance larger than a set value, which are fabricated from amorphous silicon, amorphous germanium, amorphous germanium-silicon, or amorphous carbon.

A material forming the first electrode layer includes at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum, or copper. A material forming the second electrode layer includes at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum, or copper.

At least one patterned metal interconnection layer is provided between the reflecting layer and the suspended micro-bridge structure. The patterned metal interconnection layer is located above or below the sealed release isolation layer and electrically insulated from the reflecting layer, and the patterned metal interconnection layer is configured to adjust a resonant mode of the infrared detector.

The suspended micro-bridge structure includes a third dielectric layer and a fourth dielectric layer. The infrared detector further includes a metamaterial structure and/or a polarization structure. The metamaterial structure or the polarization structure is at least one metal interconnection layer on one side of the third dielectric layer close to the CMOS measuring circuit system, or at least one metal interconnection layer on one side of the fourth dielectric layer away from the CMOS measuring circuit system, or at least one metal interconnection layer between the third dielectric layer and the fourth dielectric layer and electrically insulated from the second electrode layer, or the second electrode layer is used as a metamaterial structure layer or a polarization structure layer.

Optionally, the first columnar structure includes at least one layer of hollow columnar structure, and at least the first electrode layer is arranged in the hollow columnar structure.

The infrared detector further includes a first reinforcing structure. The first reinforcing structure is arranged corresponding to a position of the first columnar structure, and the first reinforcing structure is configured to reinforce a connection stability between the first columnar structure and the beam structure and a connection stability between the first columnar structure and the reflecting layer.

The first reinforcing structure is located at one side of the first electrode layer away from the CMOS measuring circuit system, or the first reinforcing structure is located at one side of the first electrode layer close to the CMOS measuring circuit system.

Optionally, the second columnar structure includes at least one layer of hollow columnar structure, and an electrode layer is at least arranged in the hollow columnar structure.

The infrared detector further includes a second reinforcing structure. The second reinforcing structure is arranged corresponding to a position of the second columnar structure, and the second reinforcing structure is configured to reinforce a connection stability between the second columnar structure and the absorption plate.

The second reinforcing structure is located at one side of the electrode layer away from the CMOS measuring circuit system, or the second reinforcing structure is located at one side of the electrode layer close to the CMOS measuring circuit system.

Optionally, the first columnar structure includes at least one layer of solid columnar structure, and the solid columnar structure includes a solid structure.

A side wall of the solid structure is in contact with the sacrificial layer between the corresponding beam structure and the CMOS measuring circuit system, and a material forming the solid structure includes at least one of tungsten, copper, or aluminum.

The side wall of the solid structure is coated with at least one dielectric layer, and the solid structure is arranged in contact with one dielectric layer, the material forming the solid structure includes at least one of tungsten, copper or aluminum. A material forming the dielectric layer includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper, or platinum.

The side wall of the solid structure and a surface of the solid structure close to the CMOS measuring circuit system are coated with at least one adhesive layer. The adhesive layer at an outermost periphery in the first columnar structure is coated with a dielectric layer away from the side wall of the solid structure. The material forming the solid structure includes at least one of tungsten, copper, or aluminum, a material forming the adhesive layer includes at least one of titanium, titanium nitride, tantalum or tantalum nitride, and a material forming the dielectric layer includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum.

The infrared detector further includes a first reinforcing structure. The first reinforcing structure is arranged corresponding to a position of the first columnar structure and located at one side of the first columnar structure away from the CMOS measuring circuit system. The first reinforcing structure is configured to reinforce connection stability between the first columnar structure and the beam structure. The reinforcing structure includes a weighted block structure.

The weighted block structure is located at one side of the beam structure, away from the CMOS measuring circuit system, and is arranged in contact with the beam structure. Optionally, the beam structure is formed with a through hole corresponding to the position of the first columnar structure. The through hole exposes at least part of the first columnar structure, the weighted block structure includes a first portion filling the through hole and a second portion located outside the through hole, and an orthographic projection of the second portion covers an orthographic projection of the first portion.

Optionally, the second columnar structure includes at least one layer of solid columnar structure, and the solid columnar structure includes a solid structure.

A side wall of the solid structure is in contact with the sacrificial layer between the corresponding beam structure and the CMOS measuring circuit system. A material forming the solid structure includes at least one of tungsten, copper, or aluminum.

The side wall of the solid structure is coated with at least one dielectric layer, and the solid structure is arranged in contact with a dielectric layer. The material forming the solid structure includes at least one of tungsten, copper or aluminum. A material forming the dielectric layer includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper, or platinum.

The side wall of the solid structure and a surface of the solid structure close to the CMOS measuring circuit system are coated with at least one adhesive layer. The adhesive layer at an outermost periphery in the second columnar structure is coated with a dielectric layer away from the side wall of the solid structure. the material forming the solid structure includes at least one of tungsten, copper, or aluminum. A material forming the adhesive layer includes at least one of titanium, titanium nitride, tantalum, or tantalum nitride. A material forming the dielectric layer includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper, or platinum.

The infrared detector further includes a second reinforcing structure. The second reinforcing structure is arranged corresponding to a position of the second columnar structure and located at one side of the second columnar structure away from the CMOS measuring circuit system. The beam structure is located at one side of the absorption plate close to the CMOS measuring circuit system. The second reinforcing structure is configured to reinforce a connection stability between the second columnar structure and the absorption plate. The reinforcing structure includes a weighted block structure.

The weighted block structure is located at one side of the absorption plate, away from the CMOS measuring circuit system. The weighted block structure is arranged in contact with the absorption plate, or the absorption plate is formed with a through hole corresponding to the position of the second columnar structure. The through hole exposes at least part of the second columnar structure. The weighted block structure includes a first portion filling the through hole and a second portion located outside the through hole. An orthographic projection of the second portion covers an orthographic projection of the first portion.

Optionally, the beam structure includes a thermal symmetric structure; and the suspended micro-bridge structure includes a first dielectric layer and a second dielectric layer, the first dielectric layer or the second dielectric layer between the oppositely arranged beam structures forms a patterned film layer structure, the patterned film layer structure includes a plurality of strip-shaped patterns, and the strip-shaped patterns are symmetrically arranged relative to the beam structure.

Optionally, the sealed release isolation layer is located on an interface between the CMOS measuring circuit system and the CMOS infrared sensing structure and/or located in the CMOS infrared sensing structure.

The sealed release isolation layer includes at least one dielectric layer. A dielectric material forming the sealed release isolation layer includes at least one of silicon carbide, silicon carbonitride, silicon nitride, amorphous silicon, amorphous germanium, amorphous germanium-silicon, silicon, germanium, germanium-silicon, amorphous carbon, or aluminum oxide.

Optionally, the infrared detector is based on a 3 nm, 7 nm, 10 nm, 14 nm, 22 nm, 28 nm, 32 nm, 45 nm, 65 nm, 90 nm, 130 nm, 150 nm, 180 nm, 250 nm, or 350 nm CMOS process.

A metal wiring material forming the metal interconnection layer includes at least one of aluminum, copper, tungsten, titanium, nickel, chromium, platinum, silver, ruthenium, or cobalt.

(III) Beneficial Effects

Compared with the prior art, the technical solutions provided by the embodiments of the present disclosure have the following advantages:

According to the embodiments of the present disclosure, the CMOS measuring circuit system and the CMOS infrared sensing structure are integrally fabricated on a CMOS production line by using the CMOS process. Compared with an MEMS process, the CMOS does not have a process compatibility problem, so that the technical difficulty faced by the MEMS process is solved, and risks caused by the problems of transportation cost, transportation and the like can be reduced by adopting the CMOS production line process to prepare the infrared detector. The infrared detector takes the silicon oxide as the sacrificial layer, which is completely compatible with the CMOS process, and the preparation process is simple and easy to control. The CMOS process will not cause the problem that the sacrificial layer polyimide is not released completely, which affects the vacuum degree of the detector chip. Moreover, the subsequent film growth temperature is not limited by the material of the sacrificial layer, so that the multi-layer process design of the sacrificial layer can be realized, and the planarization can be easily realized by using the sacrificial layer, reducing the process difficulty and possible risks. The infrared detector fabricated by the integrated CMOS process can achieve the targets of high yield, low cost, high productivity and large-scale integrated production of chips, thus providing a broader application market for the infrared detector. The infrared detector based on the CMOS process can make the infrared detector realize smaller feature size and thinner film thickness, which makes the infrared detector have larger duty cycle, lower thermal conductivity and smaller heat capacity, thus making the infrared detector have higher detection sensitivity, longer detection distance and better detection performance. The infrared detector based on the CMOS process can make a size of the detector pixel smaller, realize a smaller chip area under the same array of pixels, and be more conducive to the miniaturization of chips. The infrared detector based on the CMOS process has the advantages of mature production line, higher control precision, better design requirements, better product consistency, better performance adjustment of circuit chips and better industrial mass production. In addition, the hole-shaped structure on the absorption plate is beneficial to accelerating a release rate of the sacrificial layer and releasing an internal stress of the absorption plate, which optimizes a degree of planarization of the absorption plate. The hole-shaped structure on the beam structure is beneficial to further reducing thermal conductivity of the beam structure and improving infrared detection sensitivity of the infrared detector.

It is to be understood that both the foregoing general description and the following detailed description are exemplary and explanatory only and do not limit the invention.

BRIEF DESCRIPTION OF THE DRAWINGS

The accompanying drawings, which are incorporated in and constitute a part of this specification, illustrate embodiments consistent with the present disclosure and together with the specification, serve to explain the principles of the present disclosure.

In order to illustrate the technical solutions in the embodiments of the present disclosure or the prior art more clearly, the accompanying drawings to be used in the description of the embodiments or the prior art will be briefly described below. Obviously, those of ordinary skills in the art can also obtain other drawings based on these drawings without going through any creative work.

DETAILED DESCRIPTION OF THE EMBODIMENTS

In order to make the objectives, the technical solutions and the advantages of the embodiments of the present disclosure clearer, the technical solutions in the embodiments of the present disclosure will be clearly and completely described below. Apparently, the described embodiments are merely certain embodiments of the present disclosure, rather than all of the embodiments. Based on the embodiments in the present disclosure, all other embodiments obtained by those of ordinary skills in the art without going through any creative work shall fall within the protection scope of the present disclosure.

Figure 1:
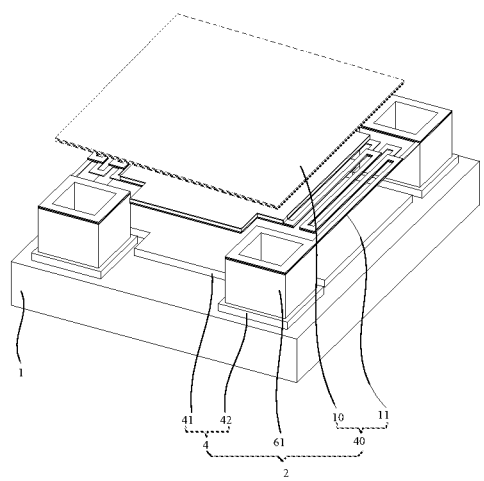
FIG. 1 is a schematic three-dimensional structure diagram of an infrared detector pixel provided by the embodiments of the present disclosure.
Figure 2:
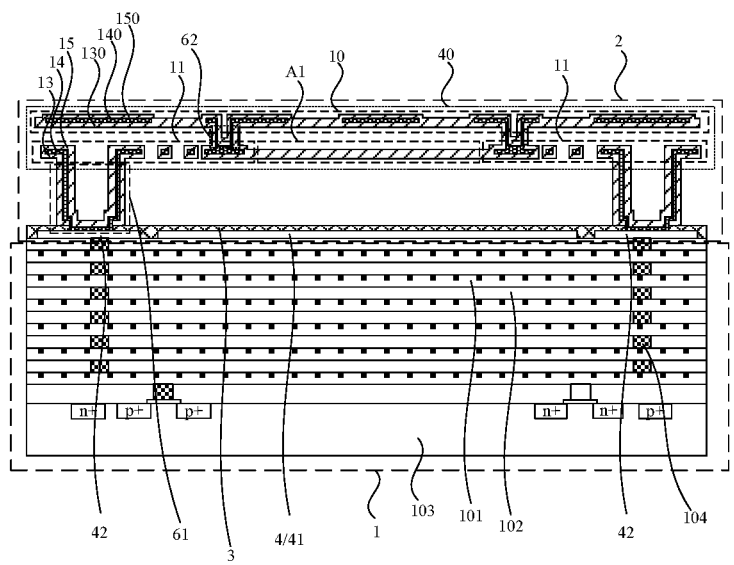
FIG. 2 is a schematic cross-sectional structural diagram of the infrared detector pixel provided by the embodiments of the present disclosure.

FIG. 1 is a schematic three-dimensional structure diagram of an infrared detector pixel provided by the embodiments of the present disclosure. FIG. 2 is a schematic cross-sectional structural diagram of the infrared detector pixel provided by the embodiments of the present disclosure. With reference to FIGS. 1 and 2, the infrared detector includes a plurality of infrared detector pixels arranged in an array. The infrared detector based on a CMOS process includes a CMOS measuring circuit system 1 and a CMOS infrared sensing structure 2. Both the CMOS measuring circuit system 1 and the CMOS infrared sensing structure 2 are fabricated by using the CMOS process, and the CMOS infrared sensing structure 2 is directly fabricated on the CMOS measuring circuit system 1.

Specifically, the CMOS infrared sensing structure 2 is configured to convert an external infrared signal into an electrical signal and transmit the electrical signal to the CMOS measuring circuit system 1, and the CMOS measuring circuit system 1 reflects temperature information corresponding to the infrared signal according to the received electrical signal to implement a temperature detection function of the infrared detector. The CMOS measuring circuit system 1 and the CMOS infrared sensing structure 2 are both fabricated by using the CMOS process, and the CMOS infrared sensing structure 2 is directly fabricated on the CMOS measuring circuit system 1, that is, the CMOS measuring circuit system 1 is first fabricated by using the CMOS process, and the CMOS infrared sensing structure 2 is continuously fabricated by using the CMOS process by using a CMOS production line and parameters of various processes compatible with the production line.

Therefore, the embodiments of the present disclosure realizes the integral preparation of the CMOS measuring circuit system 1 and the CMOS infrared sensing structure 2 on the CMOS production line by using the CMOS process, and compared with the MEMS process, the CMOS does not have a process compatibility problem, thereby solving the technical difficulty faced by the MEMS process, and using the CMOS production line process to prepare the infrared detector can also reduce a transportation cost and reduce a risk caused by the problems of transportation and the like. The infrared detector takes silicon oxide as a sacrificial layer, which is completely compatible with the CMOS process, and the preparation process is simple and easy to control. The CMOS process will not cause a problem that the sacrificial layer polyimide is not released completely, which affects a vacuum degree of a detector chip. Moreover, subsequent film growth temperature is not limited by the material of the sacrificial layer, so that multi-layer process design of the sacrificial layer can be realized, and planarization can be easily realized by using the sacrificial layer, reducing the process difficulty and possible risks. The infrared detector fabricated by the integrated CMOS process can achieve the targets of high yield, low cost, high productivity and large-scale integrated production of chips, thus providing a broader application market for the infrared detector. The infrared detector based on the CMOS process can make the infrared detector realize smaller feature size and thinner film thickness, which makes the infrared detector have larger duty cycle, lower thermal conductivity and smaller heat capacity, thus making the infrared detector have higher detection sensitivity, longer detection distance and better detection performance. The infrared detector based on the CMOS process can make a size of the detector pixel smaller, realize a smaller chip area under the same array of pixels, and be more conducive to the miniaturization of chips. The infrared detector based on the CMOS process has the advantages of mature production line, higher control precision, better design requirements, better product consistency, better performance adjustment of circuit chips and better industrial mass production.

With reference to FIG. 1 and FIG. 2, the CMOS infrared sensing structure includes a resonator cavity composed of a reflecting layer 4 and a heat-sensitive dielectric layer and a suspended micro-bridge structure 40 for controlling heat transfer.

Specifically, the CMOS infrared sensing structure 2 includes the reflecting layer 4 located on the CMOS measuring circuit system 1 and the suspended micro-bridge structure 40 for controlling heat transfer. The suspended micro-bridge structure 40 includes an absorption plate 10, the absorption plate 10 includes the heat-sensitive dielectric layer, and the resonant cavity is formed between the reflecting layer 4 and the heat-sensitive dielectric layer. The suspended micro-bridge structure 40 includes at least one layer of beam structure 11 and at least one layer of absorption plate 10, and the beam structure 11 is located at one side of the absorption plate 10 close to or away from the CMOS measuring circuit system 1. FIG. 1 exemplarily provides that the suspended micro-bridge structure 40 includes one layer of beam structure 11 and one layer of absorption plate 10, and the beam structure 11 is located at one side of the absorption plate 10 close to the CMOS measuring circuit system 1.

A first columnar structure 61 is provided between the reflecting layer 4 and the beam structure 11, and the first columnar structure 61 is directly electrically connected to a support base 42 in the reflecting layer 4 and the corresponding beam structure 11, the beam structure 11 is electrically connected to the CMOS measuring circuit system 1 through the first columnar structure 61 and the support base 42, and the first columnar structure 61 is configured to support the corresponding beam structure 11 after the sacrificial layer between the reflecting layer 4 and the corresponding beam structure 11 is released. A second columnar structure 62 is provided between the absorption plate 10 and the beam structure 11, and the second columnar structure 62 is directly electrically connected to the corresponding absorption plate 10 and the corresponding beam structure 11. The absorption plate 10 is configured to convert infrared signals into electrical signals and electrically connect to the corresponding first columnar structure 61 through the second columnar structure 62 and the corresponding beam structure 11, that is, the electrical signals converted by the infrared signals from the absorption plate 10 are transmitted to the CMOS measuring circuit system 1 through the second columnar structure 62, the beam structure 11, the first columnar structure 61 and the support base 42 in turn. The CMOS measuring circuit system 1 processes the received electrical signals to reflect the temperature information and realizes non-contact infrared temperature detection of the infrared detector. The second columnar structure 62 is configured to support the corresponding beam structure 11 or the corresponding absorption plate 10 after the sacrificial layer between the corresponding absorption plate 10 and the corresponding beam structure 11 is released.

It should be noted that the first columnar structure 61 described in the above embodiment is directly electrically connected to the support base 42 and the beam structure 11 in the reflecting layer 4, which means that the first columnar structure 61 only has two electrical connection ends, one electrical connection end of the first columnar structure 61 is directly electrically connected to the support base 42, and the other electrical connection end of the first columnar structure 61 is directly electrically connected to the beam structure 11 closest to the electrical connection end of the first columnar structure 61. The second columnar structure 62 described in the above embodiment is directly electrically connected to the absorption plate 10 and the beam structure 11, which means that the second columnar structure 62 only has two electrical connection ends, one electrical connection end of the second columnar structure 62 is directly electrically connected to the absorption plate 10 closest to the electrical connection end of the second columnar structure 62, and the other electrical connection end of the second columnar structure 62 is directly electrically connected to the beam structure 11 closest to the electrical connection end of the second columnar structure 62.

The CMOS infrared sensing structure 2 outputs a positive electric signal and a grounding electric signal through different electrode structures. The positive electric signal and the grounding electric signal are transmitted to the corresponding support base 42 through different sets of columnar structures, and one set of columnar structures includes one first columnar structure 61 and one second columnar structure 62. Illustratively, it may be arranged in a direction parallel to the CMOS measuring circuit system 1 that, the CMOS infrared sensing structure 2 includes two sets of columnar structures, one of which may be arranged for transmitting the positive electrical signal and the other for transmitting the grounding electrical signal. As shown in FIG. 1, it may also be arranged along the direction parallel to the CMOS measuring circuit system 1 that the CMOS infrared sensing structure 2 includes four sets of columnar structures, and the four sets of columnar structures can transmit the positive signal and the grounding signal in pairs. As the infrared detector includes the plurality of infrared detector pixels arranged in the array, two sets of columnar structures may also be selected to transmit the positive signal and the grounding signal respectively, and the other two sets of columnar structures may be supplied to an close infrared detector pixel for the transmission of the electrical signal. In addition, the reflecting layer 4 includes a reflecting plate 41 and the support base 42, a part of the reflecting layer 4 is configured to serve as a dielectric for electrically connecting the first columnar structure 61 and the CMOS measuring circuit system 1, that is, the support base 42, while the reflecting plate 41 is configured to reflect infrared rays to the heat-sensitive dielectric layer in the suspended micro-bridge structure 40, and to cooperate with the resonant cavity formed between the reflecting layer 4 and the heat-sensitive dielectric layer in the suspended micro-bridge structure 40 to achieve secondary absorption of the infrared rays, so as to improve an infrared absorption rate of the infrared detector and optimize an infrared detection performance of the infrared detector.

Figure 3:
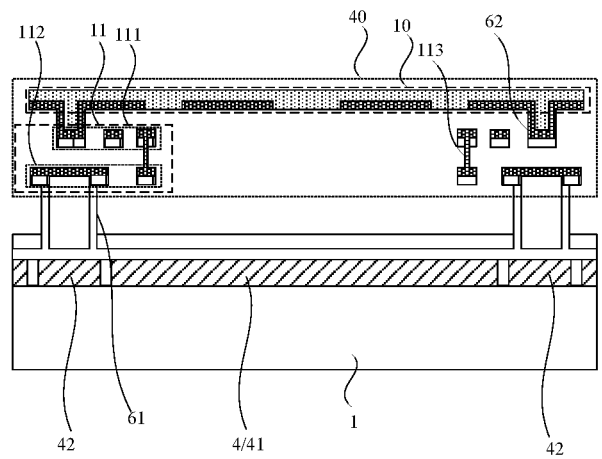
FIG. 3 is a schematic cross-sectional structural diagram of another infrared detector pixel provided by the embodiments of the present disclosure.

FIG. 3 is a schematic cross-sectional structural diagram of another infrared detector pixel provided by the embodiments of the present disclosure. As shown in FIG. 3, the suspended micro-bridge structure 40 may also be disposed to include multiple layers of beam structures 11. FIG. 3 exemplarily provides that the suspended micro-bridge structure 40 includes two layers of beam structures 11, for example, including a first layer of beam structure 111 and a second layer of beam structure 112. The first layer of beam structure 111 is located at one side of the second layer of beam structure 112 away from the CMOS measuring circuit system 1. A columnar structure 113 is also arranged between the first layer of beam structure 111 and the second layer of beam structure 112, and the columnar structure 113 is configured to support the first layer of beam structure 111 after a sacrificial layer between the first layer of beam structure 111 and the second layer of beam structure 112 is released. An electrode layer in the absorption plate 10 is electrically connected to an electrode layer in the first layer of beam structure 111 through the second columnar structure 62. The electrode layer in the first layer of beam structure 111 is electrically connected to an electrode layer in the second layer of beam structure 112 through a columnar structure 113 between the first layer of beam structure 111 and the second layer of beam structure 112. The electrode layer in the second layer of beam structure 112 is electrically connected to the first columnar structure 61. The electrical signals converted from the infrared signals by the absorption plate 10 are transmitted to the CMOS measuring circuit system 1 through the second columnar structure 62, the first layer of beam structure 111, the columnar structure 113 between the first layer of beam structure 111 and the second layer of beam structure 112, the second layer of beam structure 112, the first columnar structure 61 and the support base 42 in turn. The first columnar structure 61 is directly electrically connected to the support base 42 and the beam structure 11 closest to the CMOS measuring circuit system 1, and the second columnar structure 62 is directly electrically connected to the absorption plate 10 closest to the CMOS measuring circuit system 1 and the beam structure 11 closest to the absorption plate 10.

Figure 4:
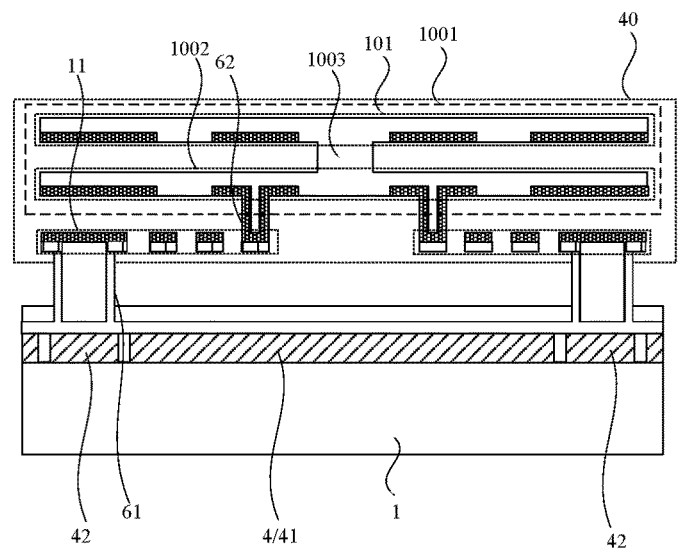
FIG. 4 is a schematic cross-sectional structural diagram of another infrared detector pixel provided by the embodiments of the present disclosure.

FIG. 4 is a schematic cross-sectional structural diagram of another infrared detector pixel provided by the embodiments of the present disclosure. As shown in FIG. 4, the suspended micro-bridge structure 40 may also be disposed to include multiple layers of absorption plates 10. FIG. 4 exemplarily provides that the suspended micro-bridge structure 40 includes two layers of absorption plates 10, for example, including a first layer of absorption plate 1001 and a second layer of absorption plate 1002. The first layer of absorption plate 1001 is located at one side of the second layer of absorption plate 1002 away from the CMOS measuring circuit system 1. A columnar structure 1003 is also arranged between the first layer of absorption plate 1001 and the second layer of absorption plate 1002, and the columnar structure 1003 is configured to support the first layer of absorption plate 1001 after a sacrificial layer between the first layer of absorption plate 1001 and the second layer of absorption plate 1002 is released. Both the first layer of absorption plate 1001 and the second layer of absorption plate 1002 include an electrode layer. The electrode layers in the two may be electrically connected through the columnar structure 1003 between the first layer of absorption plate 1001 and the second layer of absorption plate 1002, or the electrode layers in the two may not be electrically connected. The electrode layer in the second layer of absorption plate is electrically connected with the electrode layer in the beam structure 11 through the second columnar structure 62. The electrode layer in the beam structure 11 is electrically connected with the support base 42 through the first columnar structure 61, and the electric signals converted by the infrared signals from the absorption plate 10 are transmitted to the CMOS measuring circuit system 1 through the second columnar structure 62, the beam structure 11, the first columnar structure 61 and the support base 42 in turn. In addition, materials used for heat-sensitive dielectric layers in the first layer of absorption plate 1001 and the second layer of absorption plate 1002 may be the same or different. The suspended micro-bridge structure 40 is provided to include multiple layers of absorption plates 10, and heights of resonant cavities corresponding to the heat-sensitive dielectric layers in different absorption plates 10 are different, so that infrared detector can absorb infrared radiation in different wave bands. The first columnar structure 61 is directly electrically connected to the support base 42 and the beam structure 11 closest to the CMOS measuring circuit system 1, and the second columnar structure 62 is directly electrically connected to the absorption plate 10 closest to the CMOS measuring circuit system 1 and the beam structure 11 closest to the absorption plate 10.

Figure 5:
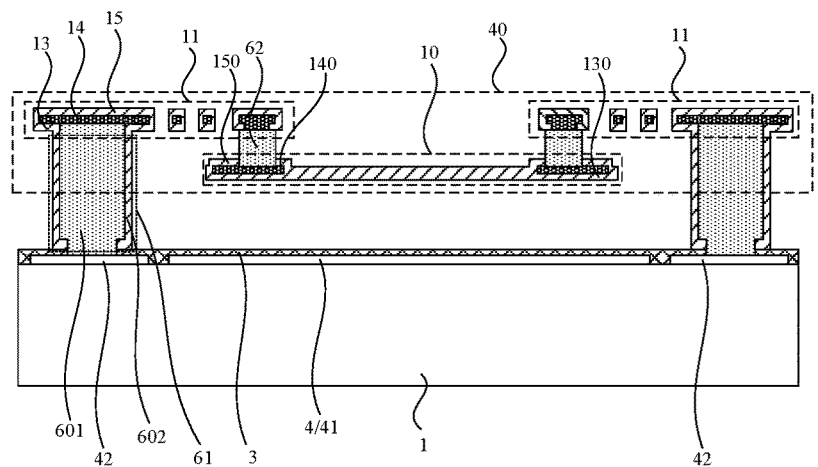
FIG. 5 is a schematic cross-sectional structural diagram of another infrared detector pixel provided by the embodiments of the present disclosure.

FIG. 5 is a schematic cross-sectional structural diagram of another infrared detector pixel provided by the embodiments of the present disclosure. Different from the structures shown in FIGS. 1 to 4, the infrared detector with the structure shown in FIG. 5 is provided that the beam structure 11 is located at one side of the absorption plate 10 away from the CMOS measuring circuit system 1, and FIG. 5 illustratively provides that the suspended micro-bridge structure 40 includes one layer of beam structure 11 and one layer of absorption plate 10. Specifically, the electrode layer in the absorption plate 10 is electrically connected to the electrode layer in the beam structure 11 through the second columnar structure 62. The electrode layer in the beam structure 11 is electrically connected to the support base 42 through the first columnar structure 61. The electrical signals converted from the infrared signals by the absorption plate 10 are transmitted to the CMOS measuring circuit system 1 through the second columnar structure 62, the beam structure 11, the first columnar structure 61 and the support base 42 in turn. When the suspended micro-bridge structure 40 includes multiple layers of beam structures 11 and multiple layers of absorption plates 10, and the beam structure 11 is located at one side of the absorption plate 10 away from the CMOS measuring circuit system 1, the first columnar structure 61 is directly electrically connected to the support base 42 and the beam structure 11 furthest to the CMOS measuring circuit system 1, and the second columnar structure 62 is directly electrically connected to the absorption plate 10 closest to the CMOS measuring circuit system 1 and the beam structure 11 closest to the absorption plate 10.

The first columnar structure 61 includes at least one layer of solid columnar structure and/or at least one layer of hollow columnar structure. The second columnar structure 62 includes at least one layer of solid columnar structure and/or at least one layer of hollow columnar structure. That is, the first columnar structure 61 may include at least one layer of solid columnar structure and may also include at least one layer of hollow columnar structure and may also include at least one layer of solid columnar structure and at least one layer of hollow columnar structure. The second columnar structure 62 may include at least one layer of solid columnar structure, may also include at least one layer of hollow columnar structure, and may also include at least one layer of solid columnar structure and at least one layer of hollow columnar structure. FIG. 2 illustratively shows that the first columnar structure 61 includes one layer of hollow columnar structure. That is, a hollow structure is formed at a position where the first columnar structure 61 is located, and the second columnar structure 62 includes one layer of hollow columnar structure, that is, a hollow columnar structure is formed at a position where the second columnar structure 62 is located. The hollow columnar structure is beneficial to reducing thermal conductivity of the first columnar structure 61 and the second columnar structure 62, so as to reduce influences of thermal conductivity generated by the first columnar structure 61 and the second columnar structure 62 on the electric signal generated by the suspended micro-bridge structure 40, which is beneficial to improving infrared detection performances of the infrared detector pixel and the infrared detector including the infrared detector pixel.

Figure 6:
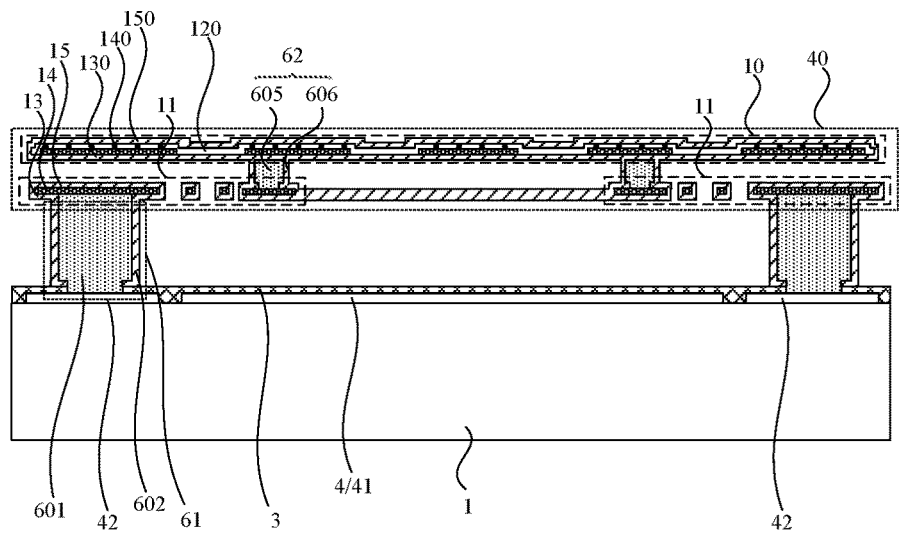
FIG. 6 is a schematic cross-sectional structural diagram of another infrared detector pixel provided by the embodiments of the present disclosure.

FIG. 6 is a schematic cross-sectional structural diagram of another infrared detector pixel provided by the embodiments of the present disclosure. As shown in FIG. 1 and FIG. 6, FIG. 6 illustratively shows that the first columnar structure 61 includes one layer of solid columnar structure, that is, a solid metal structure is formed at a position where the first columnar structure 61 is located. The second columnar structure 62 includes a solid columnar structure, that is, a solid metal structure is formed at a position where the second columnar structure 62 is located. A mechanical stability of the solid columnar structure is good, which improves a support connection stability between the first columnar structure 61 and the beam structure 11 and the support base 42 as well as between the second columnar structure 62 and the beam structure 11 and the absorption plate 10, so as to improve a structural stability of the infrared sensor pixel and the infrared detector including the infrared detector pixel. In addition, a resistor of the metal solid columnar structure is relatively small, which is beneficial to reducing signal losses during the electrical signal transmission between the absorption plate and the CMOS measuring circuit system 1, improving the infrared detection performance of the infrared detector, and a size of the metal solid columnar structure is more easily and accurately controlled, that is, the solid columnar structure can realize a columnar structure with a smaller size, which is beneficial to satisfying a smaller chip size requirement and realizing miniaturization of the infrared detector.

Figure 7:
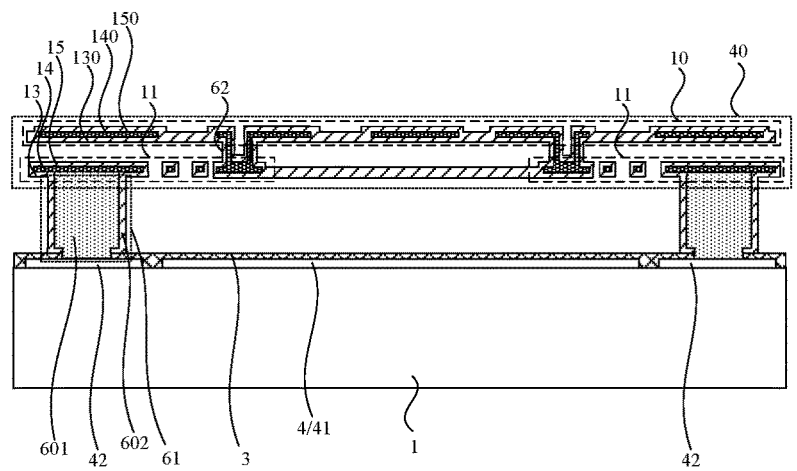
FIG. 7 is a schematic cross-sectional structural diagram of another infrared detector pixel provided by the embodiments of the present disclosure.
Figure 8:
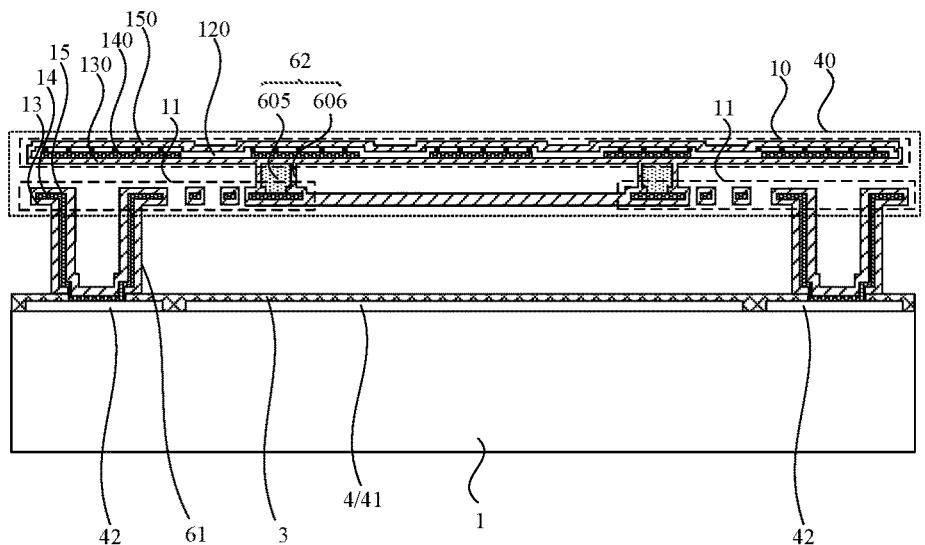
FIG. 8 is a schematic cross-sectional structural diagram of another infrared detector pixel provided by the embodiments of the present disclosure.

FIG. 7 is a schematic three-dimensional structure diagram of another infrared detector pixel provided by the embodiments of the present disclosure. FIG. 8 is a schematic cross-sectional structural diagram of another infrared detector pixel provided by the embodiments of the present disclosure. FIG. 7 illustratively shows that the first columnar structure 61 includes one layer of solid columnar structure, that is, a solid metal structure is formed at a position where the first columnar structure 61 is located, and the second columnar structure 62 includes a hollow columnar structure, that is, a hollow center is formed at a position where the second columnar structure 62 is located. FIG. 8 illustratively shows that the first columnar structure 61 includes one layer of solid columnar structure, that is, a hollow center is formed at a position where the first columnar structure 61 is located, and the second columnar structure 62 includes one layer of solid columnar structure, that is, a solid metal structure is formed at a position where the second columnar structure 62 is located, so that the infrared detector shown in FIG. 7 and FIG. 8 has the advantages of the hollow columnar structure and the solid columnar structure described in the above embodiments at the same time. In addition, in conjunction with FIG. 1 to FIG. 8, an absorption plate 9 and a beam structure 10 are arranged at different layers, and the beam structure 10 does not affect an area occupied by the absorption plate 9, which is beneficial to increasing the area occupied by the absorption plate 10 and improving an infrared detection sensitivity of the infrared detector.

Figure 9:
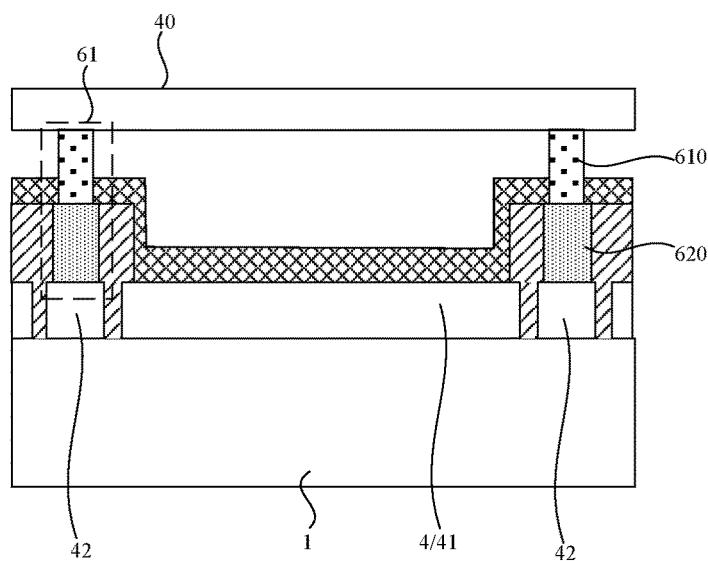
FIG. 9 is a schematic cross-sectional structural diagram of another infrared detector pixel provided by the embodiments of the present disclosure.

FIG. 9 is a schematic cross-sectional structural diagram of another infrared detector pixel provided by the embodiments of the present disclosure. As shown in FIG. 1 and FIG. 9, each of the first columnar structure 61 and the second columnar structure 62 may include multiple layers of solid columnar structures. FIG. 9 schematically shows that the first columnar structure 61 includes two layers of solid columnar structures, that is, the first columnar structure 61 includes a solid columnar structure 610 and a solid columnar structure 620. The second columnar structure 62 may also adopt a configuration mode similar to the multiple layers of solid columnar structures adopted by the first columnar structure 61 shown in FIG. 9, so that the infrared detector has the advantage of the solid columnar structure described in the above embodiments. The first columnar structure 61 and the second columnar structure 62 may also be arranged to each include multiple layers of hollow columnar structures, so that the infrared detector has the advantages of the hollow columnar structure described in the above embodiments. In addition, each of the first columnar structure 61 and the second columnar structure 62 includes multiple layers of hollow columnar structures, or each of the first columnar structure 61 and the second columnar structure 62 includes multiple layers of solid columnar structures, which can reduce types of columns in the same columnar structure, and is beneficial to simplifying a preparation process of the columnar structure.

Figure 10:
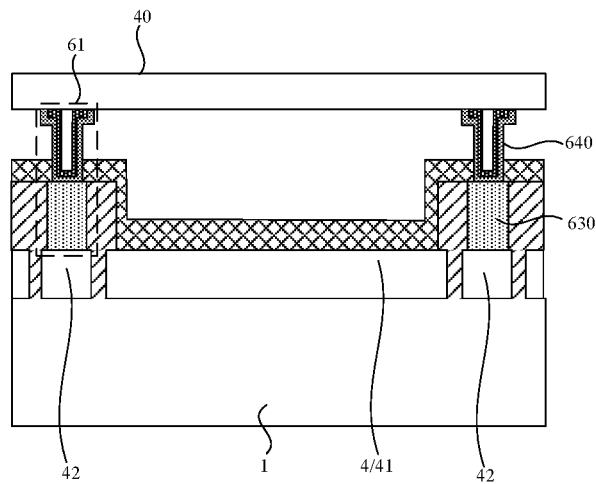
FIG. 10 is a schematic cross-sectional structural diagram of another infrared detector pixel provided by the embodiments of the present disclosure.
Figure 11:
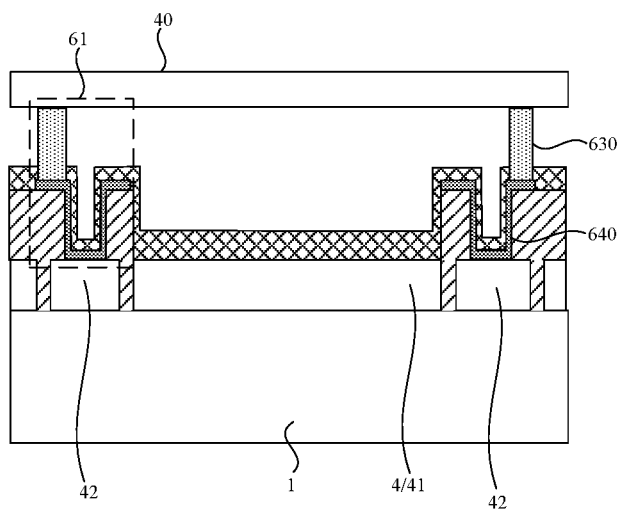
FIG. 11 is a schematic cross-sectional structural diagram of another infrared detector pixel provided by the embodiments of the present disclosure.

FIG. 10 is a schematic three-dimensional structure diagram of another infrared detector pixel provided by the embodiments of the present disclosure. FIG. 11 is a schematic cross-sectional structural diagram of another infrared detector pixel provided by the embodiments of the present disclosure. With reference to FIG. 1, FIG. 10 and FIG. 11, each of the first columnar structure 61 and the second columnar structure 62 may include at least one layer of solid columnar structure and at least one layer of hollow columnar structure. FIG. 10 and FIG. 11 schematically show that the first columnar structure 61 includes one layer of solid columnar structure 630 and one layer of hollow columnar structure 640 by taking the first columnar structure 61 as an example, FIG. 10 illustratively sets that the solid columnar structure 630 in the first columnar structure 61 is located at one side of the hollow columnar structure 640 close to the CMOS measuring circuit system 1. FIG. 11 illustratively shows that the solid columnar structure 630 in the first columnar structure 61 is located at one side of the hollow columnar structure 640 away from the CMOS measuring circuit system 1. The second columnar structure 62 may also adopt an arrangement mode of overlaying a solid columnar structure with a hollow columnar structure similar to the first columnar structure 61 shown in FIG. 10 and FIG. 11, so that the infrared detector has the advantages of the hollow columnar structure and the solid columnar structure described in the above embodiments.

For example, columns of the same layer located in the first columnar structure 61 or the second columnar structure 62 may be columns of the same type, that is, the columns located in the same layer in the first columnar structure 61 may be solid columnar structures or hollow columnar structures, and the columns located in the same layer in the second columnar structure 62 may be solid columnar structures or hollow columnar structures, so that the columns located on the same layer may be formed by using the same process steps, which is beneficial to simplifying the preparation process of the columnar structure. In addition, different types of columns may also be included in the same columnar structure, different types of columns may also be provided on the same layer, and the column type may be specifically set based on the specific requirements of the infrared detector, which is not specifically limited in the embodiments of the present disclosure.

Therefore, by providing the first columnar structure 61 and/or the second columnar structure 62 to include multiple layers of columns, a height of each layer of columns in the columnar structure may be reduced, the lower the height of the column is, the better a steepness of the column is, and therefore the column with good steepness is easily formed, so that an overall steepness of the columnar structure is optimized, an overall size of the columnar structure can also be smaller, a space occupied by the columnar structure is reduced, an effective area of the CMOS infrared sensing structure is increased, a duty ratio is further improved, and the infrared detection sensitivity of the infrared detector is improved. In addition, the columnar structure may further include more layers of columns, for example, three or more layers of columns, and each column may be a solid columnar structure or a hollow columnar structure. In addition, the columnar structure 113 between the first layer of beam structure 111 and the second layer of beam structure 112 in FIG. 3 and the columnar structure 1003 between the first layer of absorption plate 1001 and the second layer of absorption plate 1002 in FIG. 4 may also include at least one layer of solid columnar structure and/or at least one layer of hollow columnar structure, that is, the columnar structure 113 between the first layer of beam structure 111 and the second layer of beam structure 112 in FIG. 3 and the columnar structure 1003 between the first layer of absorption plate 1001 and the second layer of absorption plate 1002 in FIG. 4 may also be in the form of the hollow columnar structure, the solid columnar structure, and a combination of the hollow columnar structure and the solid columnar structure shown in the embodiments above.

With reference to FIG. 1 to FIG. 11, at least one hole-shaped structure may be formed on the absorption plate 10, and the hole-shaped structure at least penetrates through the dielectric layer in the absorption plate 10; and/or, at least one hole-shaped structure is formed on the beam structure 11, that is, it may be provided that the hole-shaped structure is formed on the absorption plate 10 only, or the hole-shaped structure is formed on the beam structure 11 only, or the hole-shaped structure is formed on both the absorption plate 10 and the beam structure 11. Illustratively, no matter the hole-shaped structure on the absorption plate 10 or the hole-shaped structure on the beam structure 11, the hole-shaped structure may be a circular hole-shaped structure, a square hole-shaped structure, a polygonal hole-shaped structure, or an irregular pattern hole-shaped structure, and shapes of the hole-shaped structures on the absorption plate 10 and the beam structure 11 are not specifically limited in the embodiments of the present disclosure, and a number of the hole-shaped structures on the absorption plate 10 and the beam structure 11 is not specifically limited in the embodiments of the present disclosure.

Therefore, at least one hole-shaped structure is formed on the absorption plate 10, the hole-shaped structure at least penetrates through the dielectric layer in the absorption plate 10, and the infrared detector is internally provided with a final sacrificial layer which is in contact with the absorption plate 10 and needs to be released finally, and the release of the sacrificial layer needs to corrode the sacrificial layer by using a chemical reagent at the end of the infrared detector manufacturing process. The hole-shaped structure on the absorption plate 10 is beneficial to increasing a contact area between the chemical reagent for release and the sacrificial layer, and accelerating a release rate of the sacrificial layer. In addition, an area of the absorption plate 10 is larger than an area of the beam structure 11, the hole-shaped structure on the absorption plate 10 is beneficial to releasing an internal stress of the absorption plate 10, optimizing a planarization degree of the absorption plate 10, and is beneficial to improving a structural stability of the absorption plate 10, so as to improve the structural stability of the whole infrared detector. In addition, at least one hole-shaped structure is formed on the beam structure 11, which is beneficial to further reducing thermal conductivity of the beam structure 11 and improving the infrared detection sensitivity of the infrared detector.

With reference to FIG. 2 and FIG. 5 to FIG. 8, the CMOS measuring circuit system 1 may include at least one sealed release isolation layer 3, and the sealed release isolation layer 3 is configured to protect the CMOS measuring circuit system 1 from process influence during a release etching course of fabricating the CMOS infrared sensing structure 2. Optionally, the sealed release isolation layer 3 is located on an interface between the CMOS measuring circuit system 1 and the CMOS infrared sensing structure 2 and/or located in the CMOS infrared sensing structure 2. That is, the sealed release isolation layer 3 may be arranged on the interface between the CMOS measuring circuit system 1 and the CMOS infrared sensing structure 2, or the sealed release isolation layer 3 may be arranged in the CMOS infrared sensing structure 2, or the sealed release isolation layer 3 is arranged in the interface between the CMOS measuring circuit system 1 and the CMOS infrared sensing structure 2, and the sealed release isolation layer 3 is also arranged in the CMOS infrared sensing structure 2. The sealed release isolation layer 3 is configured to protect the CMOS measuring circuit system 1 from erosion when the sacrificial layer is released by the corrosion process.

The sealed release isolation layer 3 includes at least one dielectric layer, and a dielectric material forming the sealed release isolation layer 3 includes at least one of silicon carbide, silicon carbonitride, silicon nitride, amorphous silicon, amorphous germanium, amorphous germanium-silicon, silicon, germanium, silicon-germanium alloy, amorphous carbon or aluminum oxide.

As shown in FIG. 2 and FIG. 5 to FIG. 8, the sealed release isolation layer 3 is located in the CMOS infrared sensing structure 2, and the sealed release isolation layer 3 may be, for example, one dielectric layer or multiple dielectric layers located above a metal interconnection layer of the reflecting layer 4. It is exemplarily showed here that the sealed release isolation layer 3 is one dielectric layer, and in this case, the material forming the sealed release isolation layer 3 may include at least one of silicon carbide, silicon carbonitride, silicon nitride, amorphous silicon, amorphous germanium, amorphous germanium-silicon, silicon, germanium, silicon-germanium alloy, amorphous carbon or aluminum oxide, and a thickness of the sealed release isolation layer 3 is less than a thickness of the sacrificial layer. The resonant cavity of the infrared detector is implemented by releasing a vacuum cavity after the silicon oxide sacrificial layer is released, the reflecting layer 4 serves as a reflecting layer of the resonant cavity, the sacrificial layer is located between the reflecting layer 4 and the suspended micro-bridge structure 40, and selecting a material such as silicon carbide, silicon carbonitride, silicon nitride, amorphous silicon, amorphous germanium, amorphous germanium-silicon, silicon, germanium, silicon-germanium alloy, amorphous carbon or aluminum oxide as a part of the resonant cavity may not affect a reflecting effect of the reflecting layer 4, and can reduce a height of the resonator cavity, thereby reducing the thickness of the sacrificial layer and reducing the difficulty of releasing the sacrificial layer composed of silicon oxide. In addition, the sealed release isolation layer 3 and the first columnar structure 61 are provided to form a closed structure to completely separate the CMOS measuring circuit system 1 from the sacrificial layer, thereby protecting the CMOS measuring circuit system 1.

Figure 12:
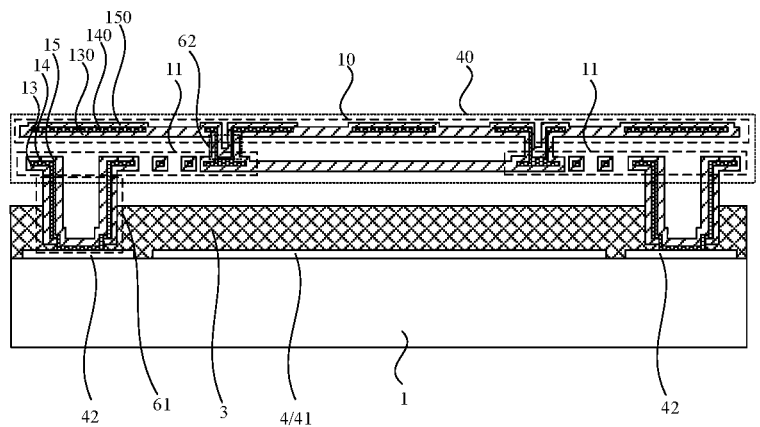
FIG. 12 is a schematic cross-sectional structural diagram of another infrared detector pixel provided by the embodiments of the present disclosure.

FIG. 12 is a schematic cross-sectional structural diagram of another infrared detector pixel provided by the embodiments of the present disclosure. Based on the above embodiments, it is similarly provided in FIG. 12 that the sealed release isolation layer 3 is located in the CMOS infrared sensing structure 2, and the sealed release isolation layer 3 may be, for example, one dielectric layer or multiple dielectric layers located above a metal interconnection layer of the reflecting layer 4. It is exemplarily shown here that the sealed release isolation layer 3 is one dielectric layer, and the sealed release isolation layer 3 coats the first columnar structure 61. In this case, a material forming the sealed release isolation layer 3 may include at least one of silicon carbide, silicon carbonitride, silicon nitride, amorphous silicon, amorphous germanium, amorphous germanium-silicon, silicon, germanium, silicon-germanium alloy, amorphous carbon or aluminum oxide, and a thickness of the sealed release isolation layer 3 is similarly less than a thickness of the sacrificial layer. By arranging the sealed release isolation layer 3 to coat the first columnar structure 61, on one hand, the sealed release isolation layer 3 may be used as the support at the first columnar structure 61, so that a stability of the first columnar structure 61 is improved, and electrical connection between the first columnar structure 61 and the suspended micro-bridge structure 40 and the support base 42 is ensured. On the other hand, the sealed release isolation layer 3 covering the first columnar structure 61 can reduce contact between the first columnar structure 61 and an external environment, reduce a contact resistance between the first columnar structure 61 and the external environment, further reduce noises of the infrared detector pixel, improve the detection sensitivity of the infrared detection sensor, and prevent exposed metal of the first columnar structure 61 from being electrically shocked. Similarly, the resonant cavity of the infrared detector is implemented by releasing the vacuum cavity after the silicon oxide sacrificial layer is released, the reflecting layer 4 serves as a reflecting layer of the resonant cavity, the sacrificial layer is located between the reflecting layer 4 and the suspended micro-bridge structure 40, and selecting the material such as silicon carbide, silicon carbonitride, silicon nitride, amorphous silicon, amorphous germanium, amorphous germanium-silicon, silicon, germanium, silicon-germanium alloy, amorphous carbon or aluminum oxide as a part of the resonant cavity may not affect a reflecting effect of the reflecting layer 4, and can reduce a height of the resonator cavity, thereby reducing the thickness of the sacrificial layer and reducing a difficulty of releasing the sacrificial layer composed of silicon oxide. In addition, the sealed release isolation layer 3 and the first columnar structure 61 are provided to form the closed structure to completely separate the CMOS measuring circuit system 1 from the sacrificial layer, thereby protecting the CMOS measuring circuit system 1.

Figure 13:
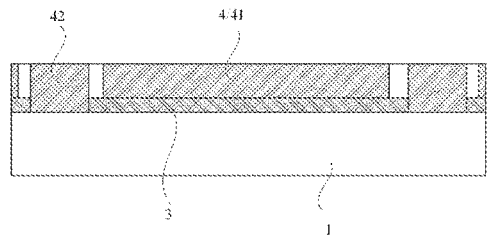
FIG. 13 is a schematic cross-sectional structural diagram of another infrared detector pixel provided by the embodiments of the present disclosure.

FIG. 13 is a schematic cross-sectional structural diagram of another infrared detector pixel provided by the embodiments of the present disclosure. Different from the infrared detector of the structure shown in the above embodiments, in the infrared detector of the structure shown in FIG. 13, the sealed release isolation layer 3 is located between the CMOS measuring circuit system 1 and the CMOS infrared sensing structure 2. For example, the sealed release isolation layer 3 is located between the reflecting layer 4 and the CMOS measuring circuit system 1, i.e., the sealed release isolation layer 3 is located below a metal interconnection layer of the reflecting layer 4, and the support base 42 is electrically connected to the CMOS measuring circuit system 1 via a through hole penetrating through the sealed release isolation layer 3. Specifically, since the CMOS measuring circuit system 1 and the CMOS infrared sensing structure 2 are both fabricated by using the CMOS process, after the CMOS measuring circuit system 1 is fabricated, a wafer containing the CMOS measuring circuit system 1 is transmitted to next process to prepare the CMOS infrared sensing structure 2. Because the silicon oxide is the most commonly used dielectric material in the CMOS process, the silicon oxide is mostly used as an insulating layer between the metal layers on the CMOS circuit. Therefore, if there is no isolation layer as a barrier when etching the silicon oxide with a thickness of about 2 μm, the circuit will be seriously affected. In order to ensure that a silicon oxide medium on the CMOS measuring circuit system is not corroded when releasing the sacrificial layer silicon oxide, the sealed release isolation layer 3 is arranged at the interface between the CMOS measuring circuit system 1 and the CMOS infrared sensing structure 2 in the embodiment of the present disclosure. After preparing and forming the CMOS measuring circuit system 1, the sealed release isolation layer 3 is fabricated and formed on the CMOS measuring circuit system 1, and the CMOS measuring circuit system 1 is protected by the sealed release isolation layer 3. In order to ensure electrical connection between the support base 42 and the CMOS measuring circuit system 1, after preparing and forming the sealed release isolation layer 3, a through hole is formed in an area of the sealed release isolation layer 3 corresponding to the support base 42 by an etching process, and the electrical connection between the support base 42 and the CMOS measuring circuit system 1 is realized through the through hole. In addition, the sealed release isolation layer 3 and the support base 42 are provided to form the closed structure to completely separate the CMOS measuring circuit system 1 from the sacrificial layer, thereby protecting the CMOS measuring circuit system 1.

Exemplarily, a material forming the sealed release isolation layer 3 may include at least one of silicon carbide, silicon carbonitride, silicon nitride, amorphous silicon, amorphous germanium, amorphous germanium-silicon, silicon, germanium, silicon-germanium alloy, amorphous carbon, or aluminum oxide. Specifically, the silicon carbide, the silicon carbonitride, the silicon nitride, the amorphous silicon, the amorphous germanium, the amorphous germanium-silicon, the silicon, the germanium, the silicon-germanium alloy, the amorphous carbon and the aluminum oxide are all CMOS process anti-corrosion materials, that is, the materials are not corroded by reagents configured to release the sacrificial layer, and therefore, the sealed release isolation layer 3 may be configured to protect the CMOS measuring circuit system 1 from being eroded when the sacrificial layer is released by the corrosion process. In addition, it may be provided that the sealed release isolation layer 3 covers the CMOS measuring circuit system 1, and the sealed release isolation layer 3 is also configured to protect the CMOS measuring circuit system 1 from process influence during a release etching course of fabricating the CMOS infrared sensing structure 2. In addition, when the reflecting layer 4 is provided with at least one sealed release isolation layer 3, a material forming the sealed release isolation layer 3 includes at least one of silicon, germanium, silicon-germanium alloy, amorphous silicon, amorphous germanium, amorphous silicon-germanium, amorphous carbon, silicon carbide, aluminum oxide, silicon nitride or silicon carbonitride, and the sealed release isolation layer 3 hardly affects a reflecting course in the resonant cavity while the sealed release isolation layer 3 is arranged to improve the stability of the first columnar structure 61, which can prevent the sealed release isolation layer 3 from affecting a reflecting course of the resonant cavity, and further avoid the influence of the sealed release isolation layer 3 on the detection sensitivity of the infrared detector.

With reference to FIG. 1 to FIG. 13, the CMOS manufacturing process of the CMOS infrared sensing structure 2 includes a metal interconnection process, a through hole process, an Inter Metal Dielectric (IMD) process, and an RDL (rewiring) process. The CMOS infrared sensing structure 2 includes at least three metal interconnection layers, at least three dielectric layers, and a plurality of interconnection through holes. The dielectric layer includes at least two sacrificial layers and one heat-sensitive dielectric layer. The metal interconnection layer includes at least a reflecting layer 4 and two electrode layers. The heat-sensitive dielectric layer includes a heat-sensitive material with a temperature coefficient of resistance greater than a set value, which may be, for example, greater than or equal to 0.015/K. The heat-sensitive material with a temperature coefficient of resistance greater than the set value forms the heat-sensitive dielectric layer, and the heat-sensitive dielectric layer is configured to convert a temperature change corresponding to infrared radiation absorbed by the heat-sensitive dielectric layer into a resistance change, so as to convert an infrared target signal into a signal which is electrically readable through the CMOS measuring circuit system 1. In addition, the heat-sensitive dielectric layer includes a heat-sensitive material with a temperature coefficient of resistance greater than a set value, which may be, for example, greater than or equal to 0.015/K, which is beneficial to improving the detection sensitivity of the infrared detector.

Specifically, the metal interconnection process is configured to electrically connect an upper metal interconnection layer and a lower metal interconnection layer, for example, electrically connect a conducting layer in the first columnar structure 61 to the support base 42. The through hole process is configured to form interconnected through holes for connecting the upper metal interconnection layer with the lower metal interconnection layer, for example, form interconnected through holes for connecting the conducting layer in the first columnar structure 61 with the support base. The IMD process is configured to realize isolation between the upper and lower metal interconnection layers, that is, electrical insulation, for example, to realize electrical insulation between the electrode layers in the absorption plate 10 and the beam structure 11 and the reflection plate 41. The RDL process is a rewiring layer process, specifically referring to re-distributing one layer of metal above a top layer of metal of the circuit and electrically the layer of metal with a metal column such as a tungsten column of the top layer of metal of the circuit. Using the RDL process can re-prepare the reflecting layer 4 in the infrared detector on the top layer of metal of the CMOS measuring circuit system 1, and the support base 42 on the reflecting layer 4 is electrically connected to the top layer of metal of the CMOS measuring circuit system 1. In addition, as shown in FIG. 2, the CMOS manufacturing process of the CMOS measuring circuit system 1 may also include a metal interconnection process and a through hole process, the CMOS measuring circuit system 1 includes metal interconnection layers 101 arranged at interval, a dielectric layer 102 and a silicon substrate 103 located at the bottom, and the upper and lower metal interconnection layers 101 are electrically connected through the through hole 104.

As shown in FIG. 1 to FIG. 13, the CMOS infrared sensing structure 2 includes the resonant cavity composed of the reflecting layer 4 and the heat-sensitive dielectric layer, and the suspended micro-bridge structure 40 for controlling heat transfer. The CMOS measuring circuit system 1 is configured to measure and process the value of the array resistor formed by one or more CMOS infrared sensing structures 2 and convert the infrared signal into the image electrical signal. The infrared detector includes a plurality of infrared detector pixels arranged in an array, and each infrared detector pixel includes one CMOS infrared sensing structure 2. Specifically, the resonant cavity may be formed by, for example, a cavity between the reflecting layer 4 and the heat-sensitive dielectric layer in the absorption plate 10, and infrared light is reflected back and forth in the resonant cavity through the absorption plate 10 to improve the detection sensitivity of the infrared detector.

Figure 14:
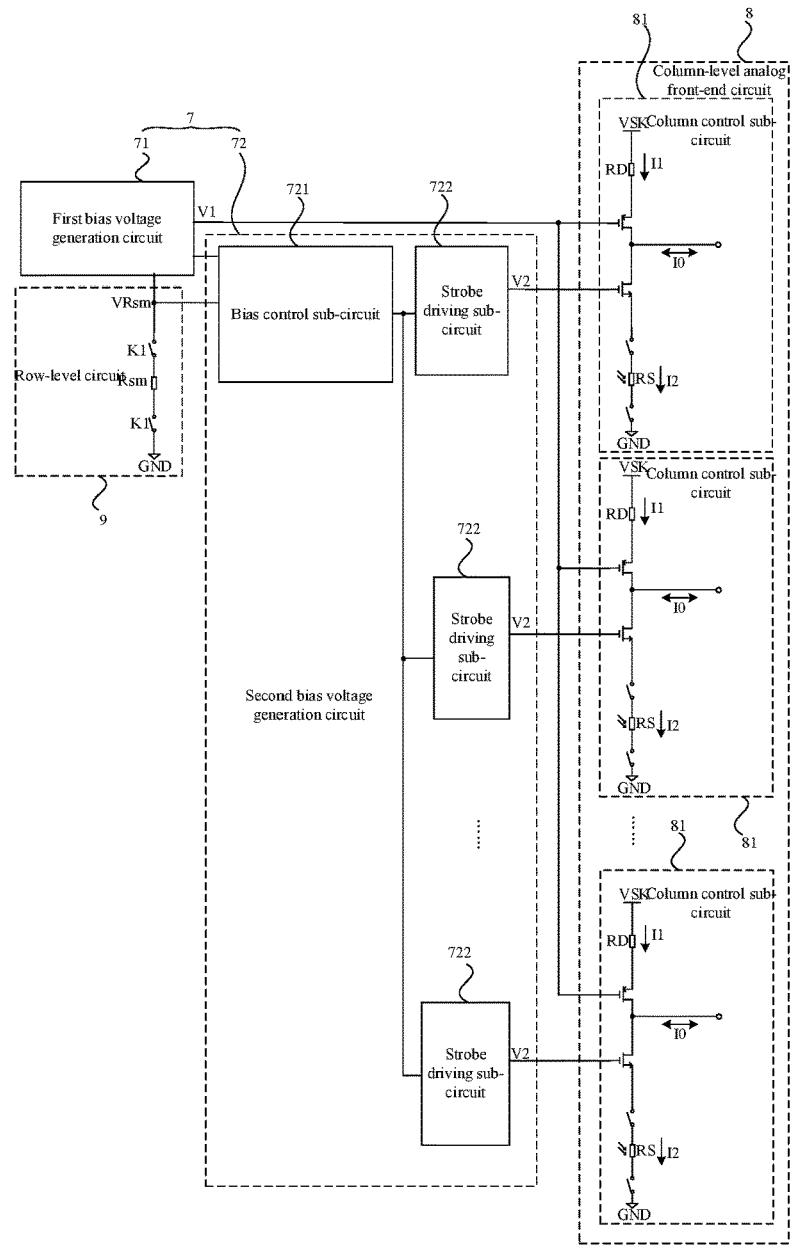
FIG. 14 is a schematic structural diagram of a CMOS measuring circuit system provided by the embodiments of the present disclosure.

FIG. 14 is a schematic structural diagram of a CMOS measuring circuit system provided by the embodiments of the present disclosure. Referring to FIG. 1 to FIG. 14, the CMOS measuring circuit system 1 includes a bias generation circuit 7, a column-level analog front-end circuit 8 and a row-level circuit 9. An input end of the bias generation circuit 7 is connected to an output end of the row-level circuit 9, and an input end of the column-level analog front-end circuit 8 is connected to an output end of the bias generation circuit 7. The row-level circuit 9 includes a row-level mirror pixel Rsm and a row selection switch K1. The column-level analog front-end circuit 8 includes a blind pixel RD. The row-level circuit 9 is distributed in each pixel and selects a to-be-processed signal according to a row strobe signal of a time sequence generation circuit, and outputs a current signal to the column-level analog front-end circuit 8 to perform current and voltage conversion output under the action of the bias generation circuit 7. When the row-level circuit 9 is strobed by the control of the row selection switch K1, a third bias voltage VRsm is output to the bias generation circuit 7. The bias generation circuit 7 outputs a first bias voltage V1 and a second bias voltage V2 according to an input constant voltage and the third bias voltage VRsm. The column-level analog front-end circuit 8 obtains two paths of currents according to the first bias voltage V1 and the second bias voltage V2, and performs transimpedance amplification on a difference between the generated two paths of currents and outputs the difference as an output voltage.

Specifically, the row-level circuit 9 includes the row-level mirror pixel Rsm and the row selection switch K1. The row-level circuit 9 is configured to generate the third bias voltage VRsm according to a strobed state of the row selection switch K1. Specifically, the row-level mirror pixel Rsm may be subjected to shading treatment, so that the row-level mirror pixel Rsm is regularly irradiated by a shade with a temperature constant equal to a substrate temperature. The row selection switch K1 may be realized by a transistor. When the row selection switch K1 is closed, the row-level mirror pixel Rsm is connected to the bias generation circuit 7, that is, the row-level circuit 9 outputs the third bias voltage VRsm to the bias generation circuit 7 when the row-level circuit is strobed under the control of the row selection switch K1. The bias generation circuit 7 may include a first bias generation circuit 71 and a second bias generation circuit 72. The first bias generation circuit 71 is configured to generate the first bias voltage V1 according to an input constant voltage, and the input constant voltage may be a positive power supply signal with a constant voltage, for example. The second bias generation circuit 72 may include a bias control sub-circuit 721 and a plurality of strobe driving sub-circuits 722. The bias control sub-circuit 721 is configured to control the strobe driving sub-circuits 722 to respectively generate corresponding second bias voltages V2 according to the third bias voltage VRsm.

The column-level analog front-end circuit 8 includes a plurality of column control sub-circuits 81, and the column control sub-circuits 81 are arranged corresponding to the strobe driving sub-circuits 722. For example, the column control sub-circuits 81 and the strobe driving sub-circuits 722 may be arranged in one-to-one correspondence, and the strobe driving sub-circuits 722 are configured to provide the second bias voltage V2 to the corresponding column control sub-circuits 81 according to the strobed states thereof. For example, it may be set that when the strobe driving sub-circuits 722 are strobed, the strobe driving sub-circuits 722 provide the second bias voltage V2 to the corresponding column control sub-circuits 81. When the strobe driving sub-circuits 722 are not strobed, the strobe driving sub-circuits 722 stop providing the second bias voltage V2 to the corresponding column control sub-circuits 81.

The column-level analog front-end circuit 8 includes an effective pixel RS and a blind pixel RD. The column control sub-circuit is configured to generate a first current I1 according to the first bias voltage V1 and the blind pixel RD, generate a second current I2 according to the second bias voltage V2 and the effective pixel RS, and perform transimpedance amplification on a difference between the first current I1 and the second current I2 and then output the difference. The row-level mirror pixel Rsm has the same temperature drift as the effective pixel RS at the same ambient temperature.

Exemplarily, the row-level mirror pixel Rsm is thermally insulated from the CMOS measuring circuit system 1 and shading processing is performed on the row-level mirror pixel Rsm. The row-level mirror pixel Rsm is regularly radiated by the shade with a temperature constant equal to the substrate temperature. The absorption plate 10 of the effective pixel RS is thermally insulated from the CMOS measuring circuit system 1, and the effective pixel RS accepts external radiation. The row-level mirror pixel Rsm and the absorption plate 10 of the effective pixel RS are both thermally insulated from the CMOS measuring circuit system 1, so that the row-level mirror pixel Rsm and the effective pixel RS both have a self-heating effect.

When the corresponding row-level mirror pixel Rsm is strobed by the row selection switch K1, resistance values of the row-level mirror pixel Rsm and the effective pixel RS both change due to Joule heat, but when the row-level mirror pixel Rsm and the effective pixel RS receive the same regular radiation, the resistance values of the row-level mirror pixel Rsm and the effective pixel RS are the same, temperature coefficients of the two are the same, and temperature drifts of the two are the same at the same environmental temperature, and the changes of the two are synchronous, which are beneficial to using the characteristic that the temperature drifts of the row-level mirror pixel Rsm and the effective pixel RS are the same at the same environmental temperature, to effectively compensate the resistance changes of the row-level mirror pixel Rsm and the effective pixel RS due to the self-heating effect, and realize stable output of the CMOS measuring circuit system 1.

In addition, by setting the second bias generation circuit 72 to include the bias control sub-circuit 721 and the plurality of strobe driving sub-circuits 722, the bias control sub-circuit 721 is configured to control the strobe driving sub-circuits 722 to respectively generate the corresponding second bias voltage V2 according to the row control signal, so that each row of pixels has one path of drive for driving the row of pixels individually, thereby reducing the requirement for the second bias voltage V2, that is, improving a driving capability of the bias generation circuit 7, and facilitating driving a larger-scale infrared detector pixel array by using the CMOS measuring circuit system 1. In addition, the specific detailed working principle of the CMOS measuring circuit system 1 is a well-known content to a person skilled in the art, and details are not described herein again.

Optionally, the CMOS infrared sensing structure 2 can be arranged on the upper layer or the same layer of the metal interconnection layer of the CMOS measuring circuit system 1. Specifically, the metal interconnection layer of the CMOS measuring circuit system 1 here may be the top layer of metal in the CMOS measuring circuit system 1. With reference to FIG. 1 to FIG. 13, the CMOS infrared sensing structure 2 may be arranged on the metal interconnection layer of the CMOS measuring circuit system 1, and the CMOS infrared sensing structure 2 is electrically connected to the CMOS measuring circuit system 1 through the support base 42 located on the upper layer of the metal interconnection layer of the CMOS measuring circuit system 1, so as to transmit the electric signals converted by the infrared signals to the CMOS measuring circuit system 1.

Figure 15:
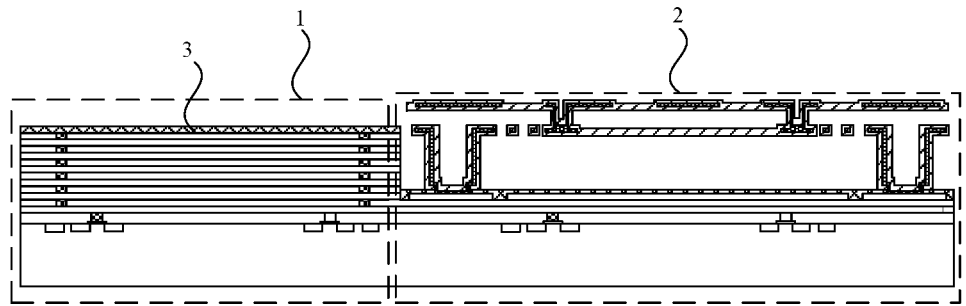
FIG. 15 is a schematic cross-sectional structural diagram of another infrared detector pixel provided by the embodiments of the present disclosure.

FIG. 15 is a schematic cross-sectional structural diagram of another infrared detector provided by the embodiments of the present disclosure. As shown in FIG. 15, the CMOS infrared sensing structure 2 may also be fabricated on the same layer of the metal interconnection layer of the CMOS measuring circuit system 1, that is, the CMOS measuring circuit system 1 and the CMOS infrared sensing structure 2 are arranged on the same layer, for example, as shown in FIG. 15, the CMOS infrared sensing structure 2 may be provided on one side of the CMOS measuring circuit system 1, and a top portion of the CMOS measuring circuit system 1 may also be provided with the sealed release isolation layer 3 to protect the CMOS measuring circuit system 1.

Optionally, in combination with FIG. 1 to FIG. 15, the sacrificial layer is configured to enable the CMOS infrared sensing structure 2 to form a hollow structure, a material forming the sacrificial layer is silicon oxide, and the sacrificial layer is corroded by using a post-CMOS process. For example, the post-CMOS process may employ at least one of gas phase hydrogen fluoride, carbon tetrafluoride, and trifluoromethane, which are corrosive to the silicon oxide, to etch the sacrificial layer. Specifically, the sacrificial layer (not shown in FIG. 1 to FIG. 15) is provided between the reflecting layer 4 and the suspended micro-bridge structure 40, between the close beam structures 11, between the close absorption plates 10, between the beam structure 11 and the absorption plate 10 close to the beam structure 11. When the sealed release isolation layer 3 is arranged on the reflecting layer 4, a sacrificial layer is provided between the sealed release isolation layer 3 and the suspended micro-bridge structure 40, and a material forming the sacrificial layer is silicon oxide, so as to be compatible with the CMOS process. The post-CMOS process may be configured to etch the sacrificial layer to release the sacrificial layer in the final infrared detection chip product.

Optionally, the absorption plate 10 is configured to absorb an infrared target signal and convert the infrared target signal into an electrical signal. The absorption plate 10 includes a metal interconnection layer and at least one heat-sensitive dielectric layer. The metal interconnection layer in the absorption plate 10 is an electrode layer in the absorption plate 10 and configured to transmit an electrical signal converted from an infrared signal. The electrode layer in the absorption plate 10 includes two patterned electrode structures, the two patterned electrode structures respectively output a positive electrical signal and a grounding electrical signal, and the positive electrical signal and the ground electrical signal are transmitted to the corresponding support base 42 through different second columnar structures 62, different beam structures 11, and different first columnar structures 61, so as to be transmitted to the CMOS measuring circuit system 1. The beam structure 11 includes at least a metal interconnection layer, the metal interconnection layer in the beam structure 11 is an electrode layer in the beam structure 11, and the electrode layer in the beam structure 11 is electrically connected to the electrode layer in the absorption plate 10.

The first columnar structure 61 is connected to the corresponding beam structure 11 and the CMOS measuring circuit system 1 by the metal interconnection process and the through hole process. In combination with FIG. 2 to FIG. 8, FIG. 12 and FIG. 15, an upper part of the first columnar structure 61 needs to be electrically connected to the electrode layer in the corresponding beam structure 11 (the beam structure 11 directly electrically connected to the first columnar structure 61) via a through hole penetrating through the sacrificial layer between the reflecting layer 4 and the corresponding beam structure 11 (the beam structure 11 directly electrically connected to the first columnar structure 61), while a lower part of the first columnar structure 61 needs to be electrically connected to the corresponding support base 42 via a through hole penetrating through the dielectric layer on the support base 42, so that the electrode layer in the beam structure 11 is electrically connected to the corresponding support base 42 via the corresponding first columnar structure 61.

The second columnar structure 62 is connected to the corresponding absorption plate 10 and the corresponding beam structure 11 by the metal interconnection process and the through hole process. In combination with FIG. 2 to FIG. 4, FIG. 6 to FIG. 8, FIG. 12 and FIG. 15, an upper part of the second columnar structure 62 needs to be electrically connected to the electrode layer in the absorption plate 10 (the absorption plate 10 directly electrically connected to the second columnar structure 62) via a through hole penetrating through the sacrificial layer between the corresponding absorption plate 10 (the absorption plate 10 directly electrically connected to the second columnar structure 62) and the corresponding beam structure 11 (the beam structure 11 directly electrically connected to the second columnar structure 62), while a lower part of the second columnar structure 62 needs to be electrically connected to the electrode layer in the corresponding beam structure 11 (the beam structure 11 directly connected to the second columnar structure 62) via a through hole penetrating through the dielectric layer covering the electrode layer in the corresponding beam structure 11 (the beam structure 11 electrically connected to the second columnar structure 62). As shown in FIG. 5, the upper part of the second columnar structure 62 needs to be electrically connected to the electrode layer in the corresponding beam structure 11 (the beam structure 11 directly electrically connected to the second columnar structure 62)

via a through hole penetrating through the sacrificial layer between the corresponding absorption plate 10 (the absorption plate 10 directly electrically connected to the second columnar structure 62) and the corresponding beam structure 11 (the beam structure 11 directly electrically connected to the second columnar structure 62), while the lower part of the second columnar structure 62 needs to be electrically connected to the electrode layer in the corresponding absorption plate 10 (the absorption plate 10 directly connected to the second columnar structure 62) via a through hole penetrating through the dielectric layer covering the electrode layer in the corresponding absorption plate 10 (the absorption plate 10 electrically connected to the second columnar structure 62). The reflecting plate 41 is configured to reflect the infrared signal and form the resonant cavity with the heat-sensitive dielectric layer, that is, the reflecting plate 41 is configured to reflect the infrared signal and form the resonant cavity with the heat-sensitive dielectric layer. The reflecting layer 4 includes at least one metal interconnect layer, and the metal interconnect layer is configured to form the support base 42, and is also configured to form the reflecting plate 41.

Optionally, the beam structure 11 includes a first dielectric layer 13, a first electrode layer 14 and a second dielectric layer 15. The absorption plate 10 includes a third dielectric layer 130 and a second electrode layer 140, or the absorption plate 10 includes a second electrode layer 140 and a fourth dielectric layer 150, or the absorption plate 10 includes a third dielectric layer 130, a second electrode layer 140 and a fourth dielectric layer 150, or the absorption plate 10 includes a support layer, a third dielectric layer 130, a second electrode layer 140 and a fourth dielectric layer 150, or the absorption plate 10 includes a third dielectric layer 130, a second electrode layer 140, a fourth dielectric layer 150 and a passivating layer, or the absorption plate 10 includes a support layer, a third dielectric layer 130, a second electrode layer 140, a fourth dielectric layer 150 and a passivating layer; wherein a material forming the first dielectric layer 13 includes at least one of materials with temperature coefficient of resistance larger than a set value, which are fabricated from which are fabricated from amorphous silicon, amorphous germanium, amorphous germanium-silicon, or amorphous carbon, a material forming the second dielectric layer 15 includes at least one of materials with temperature coefficient of resistance larger than a set value, which are fabricated from which are fabricated from amorphous silicon, amorphous germanium, amorphous germanium-silicon, or amorphous carbon, a material forming the third dielectric layer 130 includes at least one of materials with temperature coefficient of resistance larger than a set value, which are fabricated from which are fabricated from amorphous silicon, amorphous germanium, amorphous germanium-silicon, or amorphous carbon, a material forming the fourth dielectric layer 150 includes at least one of materials with temperature coefficient of resistance larger than a set value, which are fabricated from which are fabricated from amorphous silicon, amorphous germanium, amorphous germanium-silicon, or amorphous carbon, and the set value may be 0.015/K.

Specifically, in combination with FIG. 2, FIG. 5, FIG. 7, FIG. 8, FIG. 12, and FIG. 15, it may be provided that along a direction away from the CMOS measuring circuit system 1, the beam structure 11 includes the first dielectric layer 13, the first electrode layer 14 and the second dielectric layer 15 in turn, the absorption plate includes the third dielectric layer 130, the second electrode layer 140 and the fourth dielectric layer 150 in turn. That is, the beam structure 11 and the absorption plate 10 may be provided with the same film composition. It may be provided that the material forming the first dielectric layer 13 includes at least one of materials with temperature coefficient of resistance larger than a set value, which are fabricated from amorphous silicon, amorphous germanium, amorphous germanium-silicon, or amorphous carbon, the material forming the second dielectric layer 15 includes at least one of materials with temperature coefficient of resistance larger than a set value, which are fabricated from amorphous silicon, amorphous germanium, amorphous germanium-silicon, or amorphous carbon, the material forming the third dielectric layer 130 includes at least one of materials with temperature coefficient of resistance larger than a set value, which are fabricated from amorphous silicon, amorphous germanium, amorphous germanium-silicon, or amorphous carbon, and the material forming the fourth dielectric layer 150 includes at least one of materials with temperature coefficient of resistance larger than a set value, which are fabricated from amorphous silicon, amorphous germanium, amorphous germanium-silicon, or amorphous carbon. That is, the first dielectric layer 13 serves as a heat-sensitive dielectric layer while serving as a support layer, the second dielectric layer 15 also serves as a heat-sensitive dielectric layer while serving as a passivating layer, the third dielectric layer 130 serves as a heat-sensitive dielectric layer while serving as a support layer, and the fourth dielectric layer 150 also serves as a heat-sensitive dielectric layer while serving as a passivating layer, which are beneficial to reducing thicknesses of the absorption plate 10 and the beam structure 11, reducing thermal conductivity of the beam structure 11, and simplifying a preparation process of the infrared detector.

Specifically, the support layer is configured to support a film layer located above the support layer after releasing the sacrificial layer below the support layer, the heat-sensitive dielectric layer is configured to convert an infrared temperature detection signal into an infrared detection electrical signal, the second electrode layer 140 and the first electrode layer 14 are configured to transmit the infrared detection electrical signal converted from the heat-sensitive dielectric layer in the absorption plate 10 to the CMOS measuring circuit system 1 through the beam structures 11 on the left and right sides, the two beam structures 11 respectively transmit positive and negative signals of the infrared detection electrical signal, a reading circuit in the CMOS measuring circuit system 1 realizes non-contact infrared temperature detection by analyzing the acquired infrared detection electrical signal, and the passivating layer is configured to protect the electrode layer coated by the passivating layer from oxidation or corrosion. Corresponding to the beam structure 11, the first electrode layer 14 is located in a closed space formed by the first dielectric layer 13 (i.e., the support layer) and the second dielectric layer 15 (i.e., the passivating layer), so as to protect the first electrode layer 14 in the beam structure 11. Corresponding to the absorption plate 10, the second electrode layer 140 is located in a closed space formed by the third dielectric layer 130 (i.e., the support layer) and the fourth dielectric layer 150 (i.e., the passivating layer), so as to protect the second electrode layer 140 in the absorption plate 10.

Exemplarily, under the premise that the material forming the first dielectric layer 13 includes at least one of materials with temperature coefficient of resistance larger than a set value, which are fabricated from amorphous silicon, amorphous germanium, amorphous germanium-silicon, or amorphous carbon, the material forming the second dielectric layer 15 includes at least one of materials with temperature coefficient of resistance larger than a set value, which are fabricated from amorphous silicon, amorphous germanium, amorphous germanium-silicon, or amorphous carbon, the material forming the third dielectric layer 130 includes at least one of materials with temperature coefficient of resistance larger than a set value, which are fabricated from amorphous silicon, amorphous germanium, amorphous germanium-silicon, or amorphous carbon, and the material forming the fourth dielectric layer 150 includes at least one of materials with temperature coefficient of resistance larger than a set value, which are fabricated from amorphous silicon, amorphous germanium, amorphous germanium-silicon, or amorphous carbon, preferably, the film layers in the beam structure 11 and the absorption plate 10 may also meet the following conditions: in the first condition, in the direction away from the CMOS measuring circuit system 1, the beam structure 11 includes the first dielectric layer 13, the first electrode layer 14 and the second dielectric layer 15 in turn, and the absorption plate 10 includes the third dielectric layer 130 and the second electrode layer 140 in turn; in the second condition, in the direction away from the CMOS measuring circuit system 1, the beam structure 11 includes the first dielectric layer 13, the first electrode layer 14 and the second dielectric layer 15 in turn, and the absorption plate 10 includes the second electrode layer 140 and the fourth dielectric layer 150 in turn; in the third condition, in the direction away from the CMOS measuring circuit system 1, the beam structure 11 includes the first dielectric layer 13, the first electrode layer 14 and the second dielectric layer 15 in turn, and the absorption plate 10 includes the support layer, the third dielectric layer 130, the second electrode layer 140 and the fourth dielectric layer 150 in turn, or the absorption plate 10 includes the support layer, the second electrode layer 140, the third dielectric layer 130 and the fourth dielectric layer 150 in turn, or the absorption plate 10 includes the support layer, the third dielectric layer 130, the fourth dielectric layer 150 and the second electrode layer 140 in turn; in the fourth condition, in the direction away from the CMOS measuring circuit system 1, the beam structure 11 includes the first dielectric layer 13, the first electrode layer 14 and the second dielectric layer 15 in turn, and the absorption plate 10 includes the third dielectric layer 130, the second electrode layer 140, the fourth dielectric layer 150 and the passivating layer in turn, or the absorption plate 10 includes the second electrode layer 140, the third dielectric layer 130, the fourth dielectric layer 150 and the passivating layer in turn, or the absorption plate 10 includes the third dielectric layer 130, the fourth dielectric layer 150, the second electrode layer 140 and the passivating layer in turn; and in the fifth condition, in the direction away from the CMOS measuring circuit system 1, the beam structure 11 includes the first dielectric layer 13, the first electrode layer 14 and the second dielectric layer 15 in turn, and the absorption plate 10 includes the support layer, the third dielectric layer 130, the second electrode layer 140, the fourth dielectric layer 150 and the passivating layer in turn, or the absorption plate 10 includes the support layer, the second electrode layer 140, the third dielectric layer 130, the fourth dielectric layer 150 and the passivating layer in turn, or the absorption plate 10 includes the support layer, the third dielectric layer 130, the fourth dielectric layer 150, the second electrode layer 140 and the passivating layer in turn. In the above five conditions, the first dielectric layer 13, the second dielectric layer 15, the third dielectric layer 130 and the fourth dielectric layer 15 may all serve as the heat-sensitive dielectric layer, and the dielectric layer located at the bottom of the beam structure 11 or the absorption plate 10 may also serve as the support layer, and the dielectric layer located at the top of the beam structure 11 or the absorption plate 10 may also serve as the passivating layer.

Optionally, the beam structure 11 includes the first electrode layer 14, or the beam structure 11 includes the first dielectric layer 13 and the first electrode layer 14, or the beam structure 11 includes the first electrode layer 14 and the second dielectric layer 15, or the beam structure 11 includes the first electrode layer 14 and the first heat-sensitive dielectric layer, or the beam structure 11 includes the first dielectric layer 13, the first electrode layer 14 and the second dielectric layer 15, or the beam structure 11 includes the first dielectric layer 13, the first electrode layer 14 and the first heat-sensitive dielectric layer, or the beam structure 11 includes the first electrode layer 14, the first heat-sensitive dielectric layer and the second dielectric layer 15, or the beam structure 11 includes the first dielectric layer 13, the first electrode layer 14, the first heat-sensitive dielectric layer and the second dielectric layer 15. The absorption plate 10 includes the second electrode layer 140 and the second heat-sensitive dielectric layer 120, or the absorption plate 10 includes the third dielectric layer 130, the second electrode layer 140 and the second heat-sensitive dielectric layer 120, or the absorption plate 10 includes the second electrode layer 140, the second heat-sensitive dielectric layer 120 and the fourth dielectric layer 150, or the absorption plate 10 includes the third dielectric layer 130, the second electrode layer 140, the second heat-sensitive dielectric layer 120 and the fourth dielectric layer 150. The material forming the first dielectric layer 13 includes at least one of amorphous silicon, amorphous germanium, amorphous germanium-silicon, aluminum oxide or amorphous carbon, the material forming the second dielectric layer 15 includes at least one of amorphous silicon, amorphous germanium, amorphous germanium-silicon, aluminum oxide or amorphous carbon, the material forming the third dielectric layer 130 includes at least one of amorphous silicon, amorphous germanium, amorphous germanium-silicon, aluminum oxide or amorphous carbon, the material forming the fourth dielectric layer 150 includes at least one of amorphous silicon, amorphous germanium, amorphous germanium-silicon, aluminum oxide or amorphous carbon, the material forming the first heat-sensitive dielectric layer includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum, and the material forming the second heat-sensitive dielectric layer 120 includes at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum, wherein the set value may be 0.015/K.

As shown in FIG. 6, it may be provided that in the direction away from the CMOS measuring circuit system 1, the beam structure 11 includes the first dielectric layer 13, the first electrode layer 14 and the second dielectric layer 15 in turn, and the absorption plate 10 includes the third dielectric layer 130, the second electrode layer 140, the second heat-sensitive dielectric layer and the fourth dielectric layer 150 in turn; in this case, the first dielectric layer 13 and the third dielectric layer 130 both serve as the support layer, while the second dielectric layer 15 and the fourth dielectric layer 150 both serve as the passivating layer. The infrared signal is converted into the electrical signal through the second heat-sensitive dielectric layer 120. Corresponding to the beam structure 11, the first electrode layer 14 is located in a closed space formed by the first dielectric layer 13 (i.e., the support layer) and the second dielectric layer 15 (i.e., the passivating layer), so as to protect the first electrode layer 14 in the beam structure 11. Corresponding to the absorption plate 10, the second electrode layer 140 is located in a closed space formed by the third dielectric layer 130 (i.e., the support layer) and the fourth dielectric layer 150 (i.e., the passivating layer), so as to protect the second electrode layer 140 in the absorption plate 10.

Exemplarily, under the premise that the material forming the first dielectric layer 13 includes at least one of amorphous silicon, amorphous germanium, amorphous germanium-silicon, aluminum oxide or amorphous carbon, the material forming the second dielectric layer 15 includes at least one of amorphous silicon, amorphous germanium, amorphous germanium-silicon, aluminum oxide or amorphous carbon, the material forming the third dielectric layer 130 includes at least one of amorphous silicon, amorphous germanium, amorphous germanium-silicon, aluminum oxide or amorphous carbon, and the material forming the fourth dielectric layer 150 includes at least one of amorphous silicon, amorphous germanium, amorphous germanium-silicon, aluminum oxide or amorphous carbon, preferably, the film layers in the beam structure 11 and the absorption plate 10 may also meet the following conditions: in the first condition, the beam structure 11 includes the first electrode layer 14, and in the direction away from the CMOS measuring circuit system 1, the absorption plate 10 includes the second electrode layer 140 and the second heat-sensitive dielectric layer 120 in turn, or the absorption plate 10 includes the second heat-sensitive dielectric layer 120 and the second electrode layer 140 in turn; in the second condition, the beam structure 11 includes the first electrode layer 14, and in the direction away from the CMOS measuring circuit system 1, the absorption plate 10 includes the third dielectric layer 130, the second electrode layer 140 and the second heat-sensitive dielectric layer 120 in turn, or the absorption plate 10 includes the third dielectric layer 130, the second heat-sensitive dielectric layer 120 and the second electrode layer 140 in turn; in the third condition, the beam structure 11 includes the first electrode layer 14, and in the direction away from the CMOS measuring circuit system 1, the absorption plate 10 includes the second electrode layer 140, the second heat-sensitive dielectric layer 120 and the fourth dielectric layer 150 in turn, or the absorption plate 10 includes the second heat-sensitive dielectric layer 120, the second electrode layer 140 and the fourth dielectric layer 150 in turn; in the fourth condition, the beam structure 11 includes the first electrode layer 14, and in the direction away from the CMOS measuring circuit system 1, the absorption plate 10 includes the third dielectric layer 130, the second electrode layer 140, the second heat-sensitive dielectric layer 120 and the fourth dielectric layer 150 in turn, or the absorption plate 10 includes the third dielectric layer 130, the second heat-sensitive dielectric layer 120, the second electrode layer 140 and the fourth dielectric layer 150 in turn.

in the fifth condition, in the direction away from the CMOS measuring circuit system 1, the beam structure 11 includes the first dielectric layer 13 and the first electrode layer 14 in turn, or the beam structure 11 includes the first electrode layer 14 and the second dielectric layer 15 in turn, and the absorption plate 10 includes the second electrode layer 140 and the second heat-sensitive dielectric layer 120 in turn, or the absorption plate 10 includes the second heat-sensitive dielectric layer 120 and the second electrode layer 140 in turn; in the sixth condition, in the direction away from the CMOS measuring circuit system 1, the beam structure 11 includes the first dielectric layer 13 and the first electrode layer 14 in turn, or the beam structure 11 includes the first electrode layer 14 and the second dielectric layer 15 in turn, and the absorption plate 10 includes the third dielectric layer 130, the second electrode layer 140 and the second heat-sensitive dielectric layer 120, or the absorption plate 10 includes the third dielectric layer 130, the second heat-sensitive dielectric layer 120 and the second electrode layer 140 in turn; in the seventh condition, in the direction away from the CMOS measuring circuit system 1, the beam structure 11 includes the first dielectric layer 13 and the first electrode layer 14 in turn, or the beam structure 11 includes the first electrode layer 14 and the second dielectric layer 15 in turn, and the absorption plate 10 includes the second electrode layer 140, the second heat-sensitive dielectric layer 120 and the fourth dielectric layer 150 in turn, or the absorption plate 10 includes the second heat-sensitive dielectric layer 120, the second electrode layer 140 and the fourth dielectric layer 150 in turn; and in the eighth condition, in the direction away from the CMOS measuring circuit system 1, the beam structure 11 includes the first dielectric layer 13 and the first electrode layer 14 in turn, or the beam structure 11 includes the first electrode layer 14 and the second dielectric layer 15 in turn, and the absorption plate 10 includes the third dielectric layer 130, the second electrode layer 140, the second heat-sensitive dielectric layer 120 and the fourth dielectric layer 150 in turn, or the absorption plate 10 includes the third dielectric layer 130, the second heat-sensitive dielectric layer 120, the second electrode layer 140 and the fourth dielectric layer 150 in turn.

In the ninth condition, in the direction away from the CMOS measuring circuit system 1, the beam structure 11 includes the first electrode layer 14 and the first heat-sensitive dielectric layer in turn, and the absorption plate 10 includes the second electrode layer 140 and the second heat-sensitive dielectric layer 120 in turn, or the beam structure 11 includes the first heat-sensitive dielectric layer and the first electrode layer 14 in turn, and the absorption plate 10 includes the second heat-sensitive dielectric layer 120 and the second electrode layer 140 in turn; in the tenth condition, in the direction away from the CMOS measuring circuit system 1, the beam structure 11 includes the first dielectric layer 13 and the first electrode layer 14 in turn, and the absorption plate 10 includes the third dielectric layer 130, the second electrode layer 140 and the second heat-sensitive dielectric layer 120 in turn, or the beam structure 11 includes the first heat-sensitive dielectric layer and the first electrode layer 14 in turn, and the absorption plate 10 includes the third dielectric layer 130, the second heat-sensitive dielectric layer 120 and the second electrode layer 140 in turn; in the eleventh condition, in the direction away from the CMOS measuring circuit system 1, the beam structure 11 includes the first electrode layer 14 and the first heat-sensitive dielectric layer in turn, and the absorption plate 10 includes the second electrode layer 140, the second heat-sensitive dielectric layer 120 and the fourth dielectric layer 150, or the beam structure 11 includes the first heat-sensitive dielectric layer and the first electrode layer 14 in turn, and the absorption plate 10 includes the second heat-sensitive dielectric layer 120, the second electrode layer 140 and the fourth dielectric layer 150 in turn; and in the twelfth condition, in the direction away from the CMOS measuring circuit system 1, the beam structure 11 includes the first electrode layer 14 and the first heat-sensitive dielectric layer in turn, and the absorption plate 10 includes the third dielectric layer 130, the second electrode layer 140, the second heat-sensitive dielectric layer 120 and the fourth dielectric layer 150 in turn, or the beam structure 11 includes the first heat-sensitive dielectric layer and the first electrode layer 14 in turn, and the absorption plate 10 includes the third dielectric layer 130, the second electrode layer 140, the second electrode layer 140 and the fourth dielectric layer 150 in turn.

Referring to the discussion logic of the above different conditions, when the material forming the first dielectric layer 13 includes at least one of amorphous silicon, amorphous germanium, amorphous germanium-silicon, aluminum oxide or amorphous carbon, the material forming the second dielectric layer 15 includes at least one of amorphous silicon, amorphous germanium, amorphous germanium-silicon, aluminum oxide or amorphous carbon, the material forming the third dielectric layer 130 includes at least one of amorphous silicon, amorphous germanium, amorphous germanium-silicon, aluminum oxide or amorphous carbon, and the material forming the fourth dielectric layer 150 includes at least one of amorphous silicon, amorphous germanium, amorphous germanium-silicon, aluminum oxide or amorphous carbon, there may be multiple combinations of the condition where the beam structure 11 chooses one film layer and the condition where the absorption plate 10 chooses one film layer, that is, the condition where the beam structure 11 chooses one film layer and the condition where the absorption plate 10 chooses one film layer can be arbitrarily combined to form infrared detectors with various structures, which will not be described here. It should be noted that no matter which film layer arrangement solution of the beam structure 11 and the absorption plate 10 is selected, it is necessary to ensure that the beam structure 11 at least has the first electrode layer 14, and the absorption plate 12 at least has the second electrode layer 140 and the dielectric layer serving as the heat-sensitive dielectric layer.

Exemplarily, the material forming the first electrode layer 14 may be provided to include at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum or copper, wherein when at least one of titanium, titanium nitride, tantalum or tantalum nitride is used as the material forming the first electrode layer 14, the first electrode layer 14 is preferably arranged to be coated by the first dielectric layer 13 and the second dielectric layer 15 to prevent the first electrode layer 14 from being affected by the etching course. The material forming the second electrode layer 140 includes at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum or copper, wherein when at least one of titanium, titanium nitride, tantalum or tantalum nitride is used as the material forming the second electrode layer 140, the second electrode layer 140 is preferably arranged to be coated by the third dielectric layer 130 and the fourth dielectric layer 150 to prevent the second electrode layer 140 from being affected by the etching course.

In addition, as described in the above embodiments, at least one hole-shaped structure may be formed on the absorption plate 10. The hole-shaped structure at least penetrates the dielectric layer in the absorption plate 10. At least one at least one hole-shaped structure is formed on the beam structure 11. When the beam structure 11 only includes the first electrode layer 14, the hole-shaped structure on the beam structure 11 penetrates through the first electrode layer 14 in the beam structure 11. When the beam structure 11 includes the dielectric layer, the hole-shaped structure at least penetrates through the dielectric layer in the beam structure 11. Taking the infrared detector with the structure shown in FIG. 2 as an example, the hole-shaped structure on the absorption plate 10 in this case may penetrate through the third dielectric layer 130 and the fourth dielectric layer 150 in the absorption plate 10. The hole-shaped structure on the absorption plate 10 may also penetrate through the third dielectric layer 130, the second electrode layer 140 and the fourth dielectric layer 150 in the absorption plate 10. The hole-shaped structure on the beam structure 11 may penetrate through the first dielectric layer 13 and the second dielectric layer 15 at a position in the beam structure 11 not provided with the first electrode layer 14, or the hole-shaped structure on the beam structure 11 penetrates through the first dielectric layer 13, the electrode layer 14 and the second dielectric layer 15 in the beam structure 11. Taking the infrared detector with the structure shown in FIG. 6 as an example, the hole-shaped structure on the absorption plate 10 in this case may penetrate through the third dielectric layer 130 and the fourth dielectric layer 150 in the absorption plate 10. The hole-shaped structure on the absorption plate 10 may also penetrate through the third dielectric layer 130, the second electrode layer 140 and the fourth dielectric layer 150 in the absorption plate 10. The hole-shaped structure on the beam structure 11 may also penetrate through the third dielectric layer 130, the second electrode layer 140, the second heat-sensitive dielectric layer 120 and the fourth dielectric layer 150 in the absorption plate 10. The hole-shaped structure on the beam structure 11 may penetrate through the first dielectric layer 13 and the second dielectric layer 15 at the position in the beam structure 11 not provided with the first electrode layer 14, or the hole-shaped structure on the beam structure 11 penetrates through the first dielectric layer 13, the electrode layer 14 and the second dielectric layer 15 in the beam structure 11.

Figure 16:
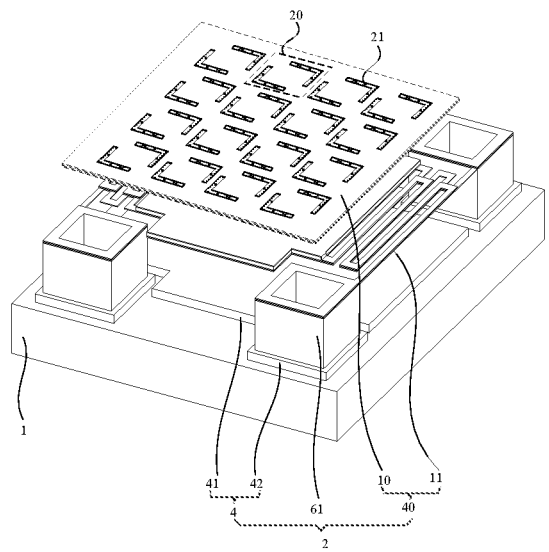
FIG. 16 is a schematic three-dimensional structure diagram of another infrared detector pixel provided by the embodiments of the present disclosure.
Figure 17:
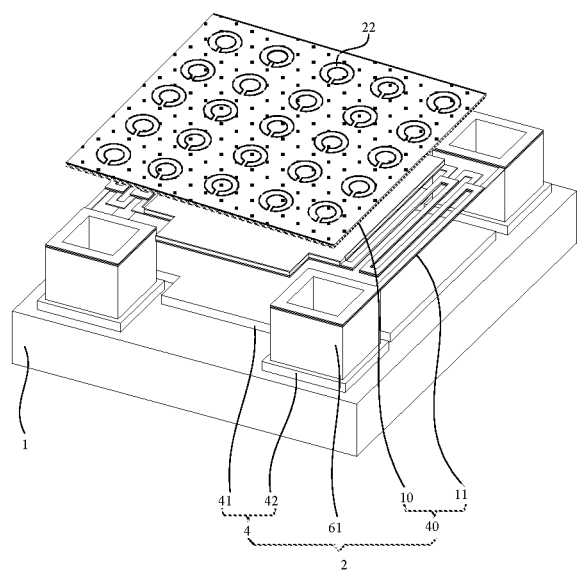
FIG. 17 is a schematic three-dimensional structure diagram of another infrared detector pixel provided by the embodiments of the present disclosure.
Figure 18:
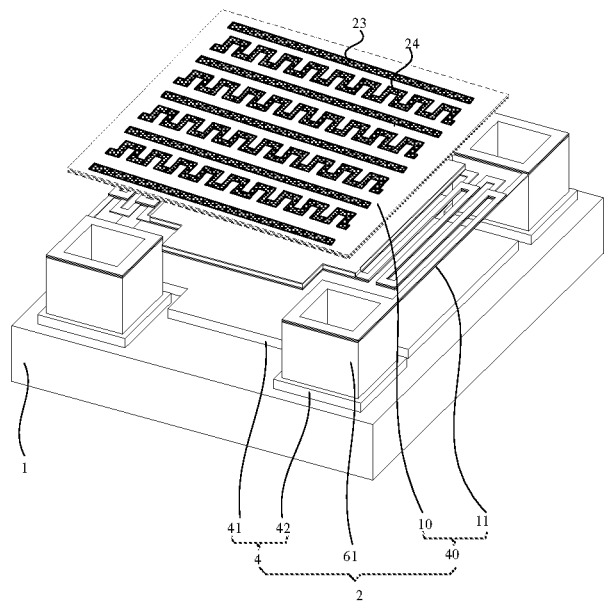
FIG. 18 is a schematic three-dimensional structure diagram of another infrared detector pixel provided by the embodiments of the present disclosure.
Figure 19:
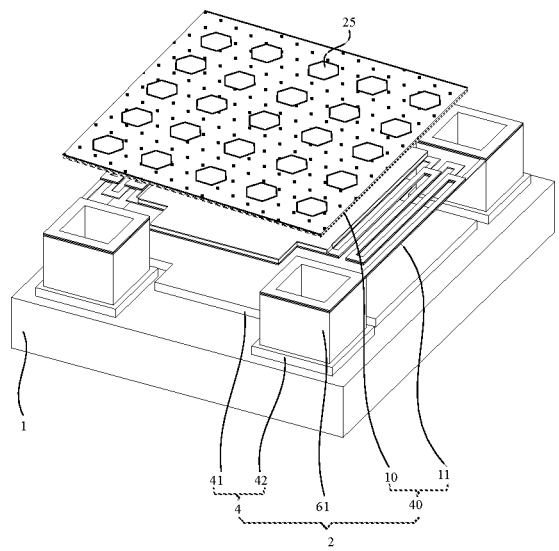
FIG. 19 is a schematic three-dimensional structure diagram of another infrared detector pixel provided by the embodiments of the present disclosure.

Optionally, the infrared detector may further include a metamaterial structure and/or a polarization structure, and the metamaterial structure or the polarization structure is at least one metal interconnection layer. FIG. 16 is a schematic three-dimensional structure diagram of another infrared detector provided by the embodiments of the present disclosure. As shown in FIG. 16, the metal interconnection layer forming the metamaterial structure may include a plurality of metal repeating units 20 arranged in an array. Each metal repeating unit includes two L-shaped patterned structures 21 arranged diagonally. In this case, an infrared absorption spectral coverage of the infrared detector ranges from 3 microns to 30 microns. As shown in FIG. 17, it may also be provided that a plurality of patterned hollow structures 22 arranged in an array are provided on the metal interconnection layer forming the metamaterial structure, and the patterned hollowed-out structures 22 are in an open circular ring shape. In this case, the infrared absorption spectral coverage of the infrared detector ranges from 3 microns to 30 microns. Also shown in FIG. 18, it may also be provided that a plurality of linear strip structures 23 and a plurality of folding strip structures 24 are provided on the metal interconnection layer forming the metamaterial structure. The linear strip structures 23 and the folding strip structures 24 are alternately arranged in a direction perpendicular to the linear strip structure 23. In this case, the infrared absorption spectral coverage of the infrared detector ranges from 8 microns to 24 microns. As shown in FIG. 19, it may also be provided that a plurality of patterned hollow structures 25 arranged in an array are provided on the metal interconnection layer forming the metamaterial structure, and the patterned hollowed-out structures 22 are in a regular hexagon shape. In this case, the infrared absorption spectral coverage of the infrared detector ranges from 3 microns to 30 microns. It should be noted that the specific pattern on the metal interconnection layer forming the metamaterial structure is not limited in the embodiments of the present disclosure, as long as the repeated pattern can achieve the function of the metamaterial structure or the polarization structure.

Specifically, the metamaterial is a material based on generalized Snell's law, carrying out electromagnetic or optical beam regulation and control by controlling wavefront phase, amplitude and polarization, or may be referred to as a metasurface or superstructure. The metasurface or superstructure is an ultra-thin two-dimensional array plane, which can flexibly and effectively control a phase, a polarization mode, a propagation mode and other characteristics of electromagnetic waves. In the embodiments of the present disclosure, an electromagnetic metamaterial structure is formed by using the patterned structure as shown in FIG. 16 to FIG. 19, that is, an artificial composite structure or composite material having supernormal electromagnetic properties is formed, so as to cut performances of electromagnetic waves and light waves, thereby obtaining an electromagnetic wave absorption special device. According to the embodiments of the present disclosure, the metamaterial structure formed by the patterned structure is combined with the infrared detector structure, the infrared electromagnetic wave absorbed by the metamaterial structure can enhance an infrared electromagnetic wave signal absorbed by the infrared detector, the infrared electromagnetic wave absorbed by the metamaterial structure is superposed with an infrared electromagnetic wave absorbed by a micro-bridge detector structure, and the infrared electromagnetic wave absorbed by the metamaterial structure is coupled with a component of the incident infrared electromagnetic wave, that is, the setting of the metamaterial structure enables an intensity of the absorbed infrared electromagnetic wave signal to be increased, so that an absorptivity of the infrared detector to the incident infrared electromagnetic wave is improved.

Figure 20:
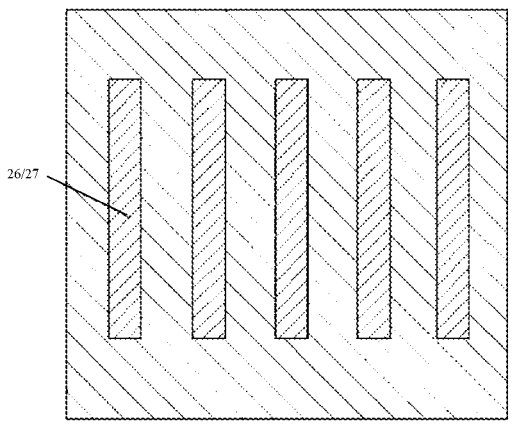
FIG. 20 is a schematic top view of a polarization structure provided by the embodiments of the present disclosure.
Figure 21:
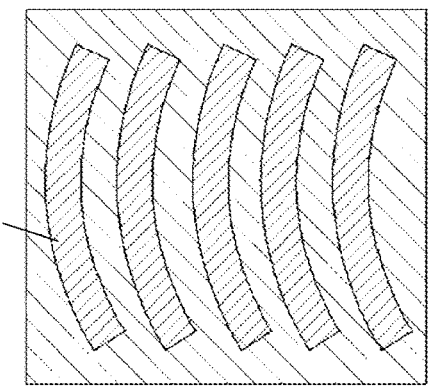
FIG. 21 is a schematic top view of another polarization structure provided by the embodiments of the present disclosure.
Figure 22:
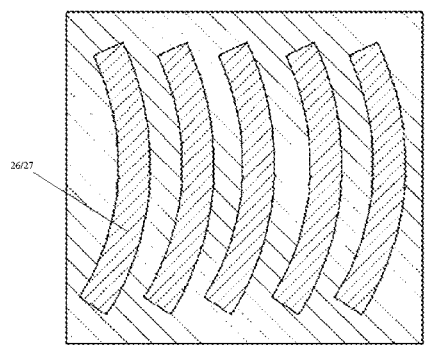
FIG. 22 is a schematic top view of another polarization structure provided by the embodiments of the present disclosure.

FIG. 20 is a schematic top view of a polarization structure provided by the embodiments of the present disclosure. As shown in FIG. 20, the polarization structure 26 may include a plurality of gratings 27 arranged in turn, and an interval between the close gratings 27 is 10 nm to 500 nm. The gratings 27 may be linear as shown in FIG. 20 or curved as shown in FIGS. 21 and 22, and the gratings 27 in the polarization structure 26 may be rotated or combined at any angle. The arrangement of the polarization structure 26 can make the CMOS sensing structure absorb polarized light in a specific direction. Illustratively, the grating 27 may be a structure formed by etching a metal film, i.e., etching the metal interconnection layer. Specifically, polarization is important information of light. Polarization detection can expand the information from three dimensions, such as light intensity, spectrum and space, to seven dimensions, such as light intensity, spectrum, space, polarization degree, polarization azimuth, polarization ellipticity and rotation direction. Because a polarization degree of a ground object background is far less than that of a man-made target, infrared polarization detection technology has very important applications in the field of space remote sensing. In an existing polarization detection system, a polarization element is independent of the detector, so it is necessary to add a polarizer on a lens of the whole detector or design a polarization lens. This method is expensive and difficult to design. The polarization information is obtained by rotating the polarization element. The disadvantages of the existing polarization detection system are that optical elements are complex and an optical path system is complex. In addition, the polarization image collected by the combination of the polarizer and the detector needs to be processed by an image fusion algorithm, which is not only complicated but also relatively inaccurate.

According to the embodiments of the present disclosure, the polarization structure 26 is monolithically integrated with the uncooled infrared detector, so that monolithic integration of a polarization-sensitive infrared detector can be realized, a difficulty of optical design is greatly reduced, an optical system is simplified, optical components are reduced, and a cost of the optical system is reduced. In addition, the image collected by the monolithically integrated polarized uncooled infrared detector is original infrared image information, and the CMOS measuring circuit system 1 can obtain accurate image information only by processing the signal detected by the infrared detector, without image fusion of the existing detector, which greatly improves authenticity and effectiveness of the image. In addition, the polarization structure 26 may also be located above the absorption plate 10 and not in contact with the absorption plate 10, that is, the polarization structure 26 may be a suspended structure located above the suspended micro-bridge structure 40. The polarization structure 26 and the suspended micro-bridge structure 40 may be supported by column connection or bonding. The polarization structure 26 and the infrared detector pixel may be bonded one-to-one or the whole chip may be bonded. Therefore, a metal grating structure suspended alone will not cause deformation of the infrared sensitive micro-bridge structure and will not affect thermal sensitivity of a sensitive film.

Exemplarily, referring to FIG. 1 to FIG. 22, the metamaterial structure is at least one metal interconnection layer, and the polarization structure is at least one metal interconnection layer. When the suspended micro-bridge structure 40 includes the third dielectric layer 130 and the fourth dielectric layer 150, the metamaterial structure or the polarization structure may be configured to be at least one metal interconnection layer at one side of the third dielectric layer 130 close to the CMOS measuring circuit system 1, for example, the metal interconnection layer forming the metamaterial structure or the polarization structure may be disposed on one side of the third dielectric layer 130 close to the CMOS measuring circuit system 1 and in contact with the third dielectric layer 130. Exemplarily, the metamaterial structure or the polarization structure may also be configured to be at least one metal interconnection layer on one side of the fourth dielectric layer 150 away from the CMOS measuring circuit system 1, for example, the metal interconnection layer forming the metamaterial structure or the polarization structure may be disposed on one side of the fourth dielectric layer 150 away from the CMOS measuring circuit system 1 and in contact with the fourth dielectric layer 150. Exemplarily, the metamaterial structure or the polarization structure may also be configured to be at least one metal interconnection layer located between the third dielectric layer 130 and the fourth dielectric layer 150 and electrically insulated from the second electrode layer 140. For example, the metal interconnection layer forming the metamaterial structure or the polarization structure may be disposed between the third dielectric layer 130 and the second electrode layer 140 and electrically insulated from the second electrode layer 140 or located between the fourth dielectric layer 150 and the second electrode layer 140 and electrically insulated from the second electrode layer 140. Exemplarily, the second electrode layer 140 may also be configured to be a metamaterial structure layer or a polarization structure layer, that is, the patterned structure described above may be formed on the second electrode layer 140.

Optionally, in combination with FIG. 6 and FIG. 7, the first columnar structure 61 may be arranged to include at least one layer of solid columnar structure, and the solid columnar structure includes a solid structure 601. FIG. 6 and FIG. 7 exemplarily provide that a side wall of the solid structure 601 of the first columnar structure 61 is coated with at least one dielectric layer 602, and the solid structure 601 is arranged in contact with one dielectric layer 602. FIG. 6 and FIG. 7 exemplarily provide that the side wall of the solid structure 601 of the first columnar structure 61 is coated with one dielectric layer 602, and the solid structure 601 is arranged in contact with the dielectric layer 602. A material forming the solid structure 601 of the first columnar structure 61 may include at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum.

Specifically, the at least one dielectric layer 602 coating the solid structure 601 of the first columnar structure 61 may act as electrical insulation, and the dielectric layer 602 is configured to protect the solid structure 601 of the first columnar structure 61 to prevent an external material from eroding the solid structure 601 of the first columnar structure 61, and the dielectric layer 602 may serve as an auxiliary support structure of the first columnar structure 61 at the same, which together supports the suspended micro-bridge structure 40 with the solid structure 601 of the first columnar structure 61, thus being beneficial to improving a mechanical stability of the first columnar structure 61, thereby improving the structural stability of the infrared sensor. In addition, a material forming the dielectric layer 602 of the first columnar structure 61 is configured to include at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum. None of the above materials can be corroded by gas phase hydrogen fluoride, carbon tetrafluoride or trifluoromethane, so the dielectric layer 602 coating the solid structure 601 of the first columnar structure 61 may not be corroded when the sacrificial layer is corroded by the gas phase hydrogen fluoride, the carbon tetrafluoride and the trifluoromethane in the subsequent process steps. Exemplarily, as shown in FIG. 6 and FIG. 7, the dielectric layer 602 coating the solid structure 601 of the first columnar structure 61 is configured to be the first dielectric layer 13 in the beam structure 11, and the dielectric layer coating the solid structure 601 of the first columnar structure 61 may be a separately manufactured dielectric layer, or the dielectric layer coating the solid structure 601 of the first columnar structure 61 may also be configured to be the second dielectric layer 15 or the first heat-sensitive dielectric layer in the beam structure 11.

Figure 23:
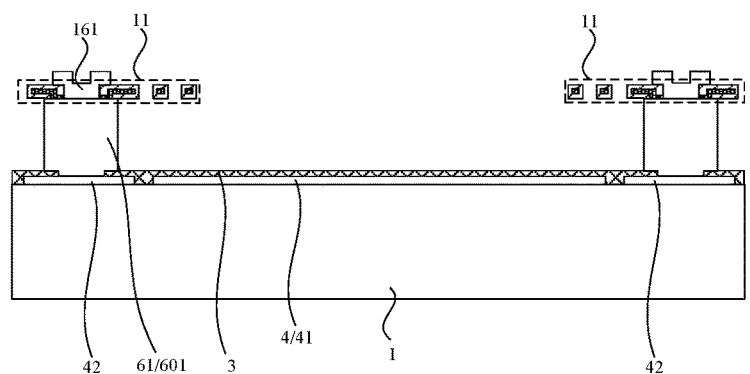
FIG. 23 is a schematic cross-sectional structural diagram of another infrared detector pixel provided by the embodiments of the present disclosure.

FIG. 23 is a schematic cross-sectional structural diagram of another infrared detector pixel provided by the embodiments of the present disclosure. FIG. 23 merely exemplarily shows the first columnar structure 61 and partial beam structure 11, but does not show the structure above the beam structure 11. Different from the infrared detectors of the structures shown in FIG. 6 and FIG. 7, for the infrared detector of the structure shown in FIG. 23, the side wall of the solid structure 601 is in contact with the sacrificial layer (not shown in FIG. 23), the sacrificial layer is the sacrificial layer between the corresponding beam structure 11 (i.e., the beam structure 11 directly electrically connected to the first columnar structure 61) and the CMOS measuring circuit system 1, and the material forming the solid structure 601 of the first columnar structure 61 includes at least one of tungsten, copper or aluminum. That is, the first columnar structure 61 is provided with only a solid tungsten column, or a solid copper column or a solid aluminum column, and the side wall of the solid structure 601 provided with the first columnar structure 61 is in contact with the sacrificial layer, so that the preparation process of the first columnar structure 61 is simple and easy to implement, and the preparation difficulty of the whole infrared detector is reduced.

Figure 24:
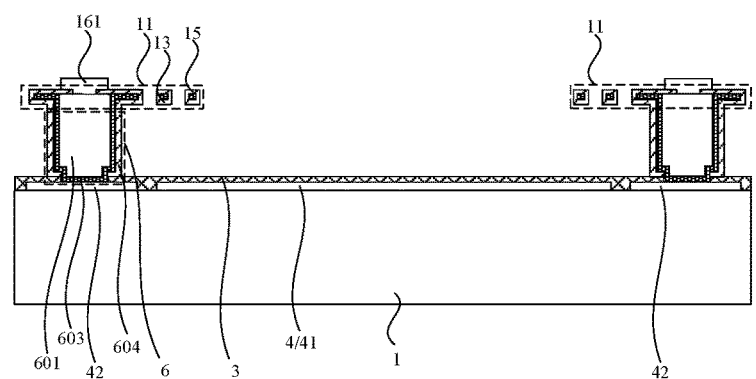
FIG. 24 is a schematic cross-sectional structural diagram of another infrared detector pixel provided by the embodiments of the present disclosure.

FIG. 24 is a schematic cross-sectional structural diagram of another infrared detector pixel provided by the embodiments of the present disclosure. Similarly, FIG. 24 merely exemplarily shows the first columnar structure 61 and partial beam structure 11, but does not show the structure above the beam structure 11. Different from the infrared detectors of the structures shown in FIG. 6 and FIG. 7, the infrared detector of the structure shown in FIG. 24 is that the side wall of the solid structure 601 of the first columnar structure 61 and a surface of the solid structure 601 of the first columnar structure 61 close to the CMOS measuring circuit system 1 are coated with at least one adhesive layer 603. FIG. 24 illustratively provides that the side wall of the solid structure 601 of the first columnar structure 61 is provided and the surface of the solid structure 601 of the first columnar structure 61 close to the CMOS measuring circuit system 1 is coated with at least one adhesive layer 603, and the adhesive layer 603 in the outermost periphery of the first columnar structure 61 away from side wall of the solid structure 601 of the first columnar structure 61 is coated with a dielectric layer 604. The material forming the solid structure 601 forming the first columnar structure 61 includes at least one of tungsten, titanium nitride, tantalum or tantalum nitride, and a material forming the dielectric layer 604 includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum.

Specifically, the adhesive layer 603 is configured to enhance a connection performance between the first columnar structure 61 and the support base 42, including enhancing a mechanical connection performance and improving the structural stability, and enhancing an electrical connection performance and reducing a contact resistance, reducing losses in an electrical signal transmission course, and improving the infrared detection performance of the infrared detector. Moreover, by arranging the adhesive layer 603 to surround a side face of the solid structure 601 of the first columnar structure 61, a contact area between the adhesive layer 603 and the solid structure 601 of the first columnar structure 61 can be increased, which is equivalent to widening a transmission channel of electric signals and reducing a transmission resistance of the first columnar structure 61, thereby further reducing transmission losses of the electric signals and improving the infrared detection performance of infrared detector. Moreover, a material forming the adhesive layer 603 includes at least one of titanium, titanium nitride, tantalum or tantalum nitride. Using at least one of the above four conductive materials to form the adhesive layer 603 can meet the requirement of enhancing the mechanical and electrical connection performances between the support base 42 and the first columnar structure 61 by using the adhesive layer 603, and is beneficial to realizing the requirement of preparing the adhesive layer 603 by using the CMOS process, that is, meeting the integrated requirement of the CMOS process.

The adhesive layer 603 in the outermost periphery of the first columnar structure 61 away from the side wall of the solid structure 601 of the first columnar structure 61 is also coated with the dielectric layer 604. While using the adhesive layer 603 to enhance the connection performance between the first columnar structure 61 and the support base 42, the dielectric layer 604 coated on the side wall of the adhesive layer 603 plays the role of insulation protection and can play the role of auxiliary support for the first columnar structure 61, so as to improve the structural stability and infrared detection performance of the infrared detector. Similarly, the material forming the dielectric layer 604 may include at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum. None of the above materials can be corroded by gas phase hydrogen fluoride, carbon tetrafluoride or trifluoromethane, so the dielectric layer 604 coating the adhesive layer 603 may not be corroded when the sacrificial layer is corroded by the gas phase hydrogen fluoride, the carbon tetrafluoride and the trifluoromethane in the subsequent process steps. Exemplarily, as shown in FIG. 24, the adhesive layer 603 coating the solid structure 601 of the first columnar structure 61 may be configured to be the first electrode layer 14 in the beam structure 11, the dielectric layer 604 coating the adhesive layer 603 is the first dielectric layer 13 in the beam structure 11, the adhesive layer 603 coating the solid structure 601 of the first columnar structure 61 and/or the dielectric layer coating the adhesive layer 603 may also be independently manufactured film layers, or the dielectric layer coating the adhesive layer 603 may also be provided as the second dielectric layer 15 or the first heat-sensitive dielectric layer in the beam structure 11.

Optionally, referring to FIG. 23 and FIG. 24, the infrared detector may further include a first reinforcing structure 161, the first reinforcing structure 161 is arranged corresponding to a position of the first columnar structure 61, the first reinforcing structure 161 is configured to enhance a connection stability between the first columnar structure 61 and the beam structure 11, and the first reinforcing structure 161 includes a weighted block structure. Specifically, the arrangement of the first reinforcing structure 161 can effectively enhance a mechanical stability between the first columnar structure 61 and the beam structure 11, thereby improving the structural stability of the infrared detector pixel and the infrared detector comprising the infrared detector pixel.

Figure 25:
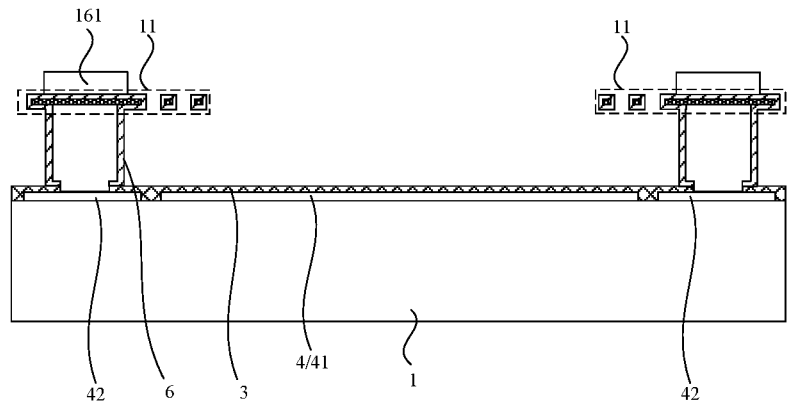
FIG. 25 is a schematic cross-sectional structural diagram of another infrared detector pixel provided by the embodiments of the present disclosure.

FIG. 25 is a schematic cross-sectional structural diagram of another infrared detector pixel provided by the embodiments of the present disclosure. FIG. 25 also merely exemplarily shows the first columnar structure 61 and part of the beam structure 11, but does not show a structure above the beam structure 11. As shown in FIG. 25, the weighted block structure forming the first reinforcing structure 161 may be disposed on one side of the beam structure 11 away from the CMOS measuring circuit system 1 and the weighted block structure forming the first reinforcing structure 161 is in contact with the beam structure 11. Specifically, the weighted block structure forming the first reinforcing structure 161 is configured to located at one side of the beam structure 11 away from the CMOS measuring circuit system 1 and the weighted block structure forming the first reinforcing structure 161 is in contact with the beam structure 11, which is equivalent to adding one cover plate at a position of the beam structure 11 corresponding to the first columnar structure 61, and pressing the beam structure by using a weight of the first reinforcing structure 161, so that a mechanical strength between the beam structure 11 and the first columnar structure 61 is enhanced, and a structural stability of the infrared detector is improved.

Exemplarily, in combination with FIG. 23 and FIG. 24, the beam structure 11 may also be provided with a through hole corresponding to a position where the first columnar structure 61 is located, the through hole exposes at least a portion of the first columnar structure 61, the weighted block structure forming the first reinforcing structure 161 includes a first portion filling the through hole and a second portion located outside the through hole, and an orthographic projection of the second portion covers an orthographic projection of the first portion. Specifically, the beam structure 11 is formed with a hollow area corresponding to the position where the first columnar structure 61 is located, i.e., formed with the through hole, the second portion of the weighted block structure forming the first reinforcing structure 161 outside the through hole is integrally formed with the first portion of the weighted block structure in the through hole, the first portion is filled or embedded in the through hole and is in contact with the first columnar structure 61. The orthographic projection of the second portion covers the orthographic projection of the first portion, i.e., an area of the second portion is greater than an area of the first portion. In the infrared detector pixel, the first reinforcing structure 161 is equivalent to a rivet structure composed of the first portion and the second portion, a bottom surface of the first portion is in contact with a top surface of the columnar structure, a side surface of the first portion is further in contact with a side surface of the hollow area formed by the beam structure, and a lower surface of the second portion is in contact with an outer surface of the through hole. Therefore, while the beam structure 11 is pressed by a gravity of the first reinforcing structure 161, a contact area between the first reinforcing structure 161 and the first columnar structure 61 and the beam structure 11 is also increased, the mechanical strength between the beam structure 11 and the first columnar structure 61 is further increased, and the structural stability of the infrared detector is improved.

Exemplarily, a material forming the weighted block structure forming the first reinforcing structure 161 may be configured to include at least one of amorphous silicon, amorphous germanium, amorphous silicon-germanium, amorphous carbon, silicon carbide, aluminum oxide, silicon nitride, silicon carbonitride, silicon oxide, silicon, germanium, germanium-silicon, aluminum, copper, wolfram, gold, platinum, nickel, chromium, titanium-tungsten alloy, nickel-chromium alloy, nickel-platinum alloy or nickel-silicon alloy. Specifically, the first reinforcing structure 161 may be a single-layer structure deposited by a medium or a metal, or may be a multi-layer structure formed by stacking two, three or more single-layer structures. None of amorphous silicon, amorphous germanium, amorphous silicon-germanium, amorphous carbon, silicon carbide, aluminum oxide, silicon nitride, silicon carbonitride, silicon, germanium, germanium-silicon, aluminum, copper, wolfram, gold, platinum, nickel, chromium, titanium-tungsten alloy, nickel-chromium alloy, nickel-platinum alloy or nickel-silicon alloy can be corroded by gas phase hydrogen fluoride, carbon tetrafluoride or trifluoromethane, so the reinforcing structure 161 may not be affected when the sacrificial layer is corroded by the gas phase hydrogen fluoride, the carbon tetrafluoride and the trifluoromethane and released in the subsequent process steps, thus ensuring that the arrangement of the first reinforcing structure 161 enhances a mechanical strength of a joint of the beam structure 11 and the first columnar structure 61, and the beam structure 11 and the first columnar structure 6 are prevented from falling off due to infirm connection, so that the structural stability of the infrared detector is improved. In addition, when the material forming the reinforcing structure 161 includes silicon oxide, since the silicon oxide is corroded by the vapor phase hydrogen fluoride, the carbon tetrafluoride or the trifluoromethane, it is preferable that the reinforcing structure 161 may be provided in a closed space enclosed by the first dielectric layer 13 and the second dielectric layer 15.

Optionally, in combination with FIG. 6 and FIG. 8, the second columnar structure 62 may be arranged to include at least one layer of solid columnar structure, and the solid columnar structure includes a solid structure 605. FIG. 6 and FIG. 8 exemplarily provide that a side wall of the solid structure 605 of the second columnar structure 62 is coated with at least one dielectric layer 606, and the solid structure 605 of the second columnar structure 62 is arranged in contact with one dielectric layer 605. FIG. 6 and FIG. 8 exemplarily provide that the side wall of the solid structure 605 of the second columnar structure 62 is coated with one dielectric layer 606, and the solid structure 605 of the second columnar structure 62 is arranged in contact with the dielectric layer 605. A material forming the solid structure 605 may include at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum.

Specifically, the at least one dielectric layer 606 coating the solid structure 605 of the second columnar structure 62 may act as electrical insulation, and the dielectric layer 606 is configured to protect the solid structure 605 of the second columnar structure 62 to prevent an external material from eroding the solid structure 605 of the second columnar structure 62, and the dielectric layer 606 may serve as an auxiliary support structure of the second columnar structure 62 at the same. The dielectric layer 606 together supports the absorption plate 10 with the solid structure 605 of the second columnar structure 62, thus being beneficial to improving a mechanical stability of the second columnar structure 62, thereby improving the structural stability of the infrared sensor. In addition, the material forming the dielectric layer 606 of the second columnar structure 62 is configured to include at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum. None of the above materials can be corroded by gas phase hydrogen fluoride, carbon tetrafluoride or trifluoromethane, so the dielectric layer 606 coating the solid structure 605 of the second columnar structure 62 may not be corroded when the sacrificial layer is corroded by the gas phase hydrogen fluoride, the carbon tetrafluoride and the trifluoromethane in the subsequent process steps. Exemplarily, as shown in FIG. 6 and FIG. 8, the dielectric layer 606 coating the solid structure 605 of the second columnar structure 62 is configured to be the third dielectric layer 130 in the absorption plate 10, and the dielectric layer coating the solid structure 605 of the second columnar structure 62 may also be a separately manufactured dielectric layer, or the dielectric layer coating the solid structure 605 of the second columnar structure 62 may also be configured to be the fourth dielectric layer 150 or the second heat-sensitive dielectric layer 120 in the absorption plate 10.

Illustratively, similar to the arrangement of the first columnar structure 61 in the structure shown in FIG. 23, the side wall of the solid structure 605 of the second columnar structure 62 is in contact with the sacrificial layer. The sacrificial layer is the sacrificial layer sacrificial layer between the corresponding absorption plate 10 (i.e., the absorption plate 10 directly electrically connected to the second columnar structure 62) and the corresponding beam structure 11 (i.e., the beam structure 11 directly electrically connected to the second columnar structure 62). That is, the sacrificial layer is the sacrificial layer corresponding to the second columnar structure 62. It may be provided that the material forming the solid structure 605 of the second columnar structure 62 includes at least one of tungsten, copper or aluminum. Specific effects of a film layer in the second columnar structure 62 and the second columnar structure 62 are similar to effects of the first columnar structure 61 shown in FIG. 23, and details are not described herein again. Similarly to the arrangement of the first columnar structure 61 in the structure shown in FIG. 24, the side wall of the solid structure 605 of the second columnar structure 62 and a surface of the solid structure 605 of the second columnar structure 62 close to the CMOS measuring circuit system 1 are coated with at least one adhesive layer, and the adhesive layer in the outermost periphery of the second columnar structure 62 away from side wall of the solid structure 605 of the second columnar structure 62 is coated with a dielectric layer. The material forming the solid structure 605 of the second columnar structure 62 includes at least one of tungsten, titanium nitride, tantalum or tantalum nitride, and a material forming the dielectric layer in the second columnar structure 62 includes at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum. The specific effects of the film layer in the second columnar structure 62 and the second columnar structure 62 are similar to the effects of the first columnar structure 61 shown in FIG. 23, and details are not described herein again.

Similarly, by analogy with the arrangement of the first reinforcing structure 161 corresponding to the first columnar structure 61 in the structures shown in FIG. 23, FIG. 24 and FIG. 25, the infrared detector is configured to further include a second reinforcing structure, the second reinforcing structure is disposed corresponding to a position of the second columnar structure 62 and located at one side of the second columnar structure 62 away from the CMOS measuring circuit system 1, and the beam structure 11 is located at one side of the absorption plate 10 close to the CMOS measuring circuit system 1. The second reinforcing structure is configured to enhance a connection stability between the second columnar structure 62 and the absorption plate 10, and the second reinforcing structure includes a weighted block structure.

Similarly, by analogy with the arrangement of the first reinforcing structure 161 corresponding to the first columnar structure 61 in the structure shown in FIG. 25, the weighted block structure forming the second reinforcing structure may be configured to be located at one side of the absorption plate 10 away from the CMOS measuring circuit system 1, and the weighted block structure forming the second reinforcing structure is arranged in contact with the absorption plate 10. A reinforcing principle of the second reinforcement structure is similar to a reinforcing principle of the first reinforcement structure 161 of the structure shown in FIG. 25, which will not be repeated here. Or, by analogy with the arrangement of the first reinforcing structure 161 corresponding to the first columnar structure 61 in the structure shown in FIG. 23 and FIG. 24, the absorption plate 10 may be provided with a through hole corresponding to the position of the second columnar structure 62. The through hole exposes at least part of the second columnar structure 62, and the weighted block structure forming the second reinforcing structure includes a first portion filling the through hole and a second portion located outside the through hole. An orthographic projection of the second portion covers an orthographic projection of the first portion, and the reinforcing principle of the second reinforcing structure is similar to the reinforcing principle of the first reinforcing structure 161 of the structure shown in FIG. 23 and FIG. 24, which will not be repeated here. In addition, a material used in the weighted block structure forming the second reinforcing structure may be the same as a material used in the weighted block structure forming the first reinforcing structure 161, which will not be repeated here.

Optionally, in combination with FIG. 2 and FIG. 8, the first columnar structure 61 may be configured to include at least one layer of hollow columnar structure. FIG. 2 and FIG. 8 exemplarily provide that the first columnar structure 61 includes one layer of hollow columnar structure. At least a first electrode layer 14 is arranged in the hollow columnar structure, and the first electrode layer 14 in the hollow columnar structure is electrically connected to the first electrode layer 14 in the beam structure 11, the second electrode layer 140 in the absorption plate 10, and the support base 42, to ensure that the electrical signal generated by the absorption plate 10 is transmitted to the CMOS measuring circuit system 1. FIG. 2 and FIG. 8 exemplarily provide that the hollow columnar structure forming the first columnar structure 61 is provided with the first electrode layer 14 and the dielectric layers located at both sides of the first electrode layer 14, which effectively protect the first electrode layer 14, prevent the first electrode layer 14 from being oxidized or corroded, and optimize electric transmission characteristics of the infrared detector. Exemplarily, the dielectric layer located below the first electrode layer 14 in the first columnar structure 61, for example, may be the first dielectric layer 13 in the beam structure 11, and the dielectric layer located above the first electrode layer 14, for example, may be the second dielectric layer 15 in the beam structure 11. The dielectric layers at both sides of the first electrode layer 14 may also be separately manufactured film layers. In addition, it may be arranged that in the first columnar structure 61, no dielectric layer is arranged above and/or below the first electrode layer 14, that is, it may be arranged that the dielectric layer is only arranged below the first electrode layer 14 or above the first electrode layer 14 in the hollow columnar structure, or only the first electrode layer 14 is only arranged in the hollow columnar structure, and the outside of the first electrode layer 14 is not coated with the dielectric layer.

Figure 26:
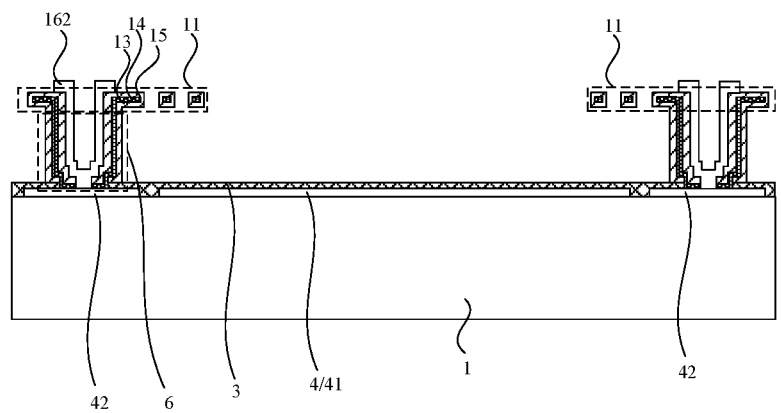
FIG. 26 is a schematic cross-sectional structural diagram of another infrared detector pixel provided by the embodiments of the present disclosure.
Figure 27:
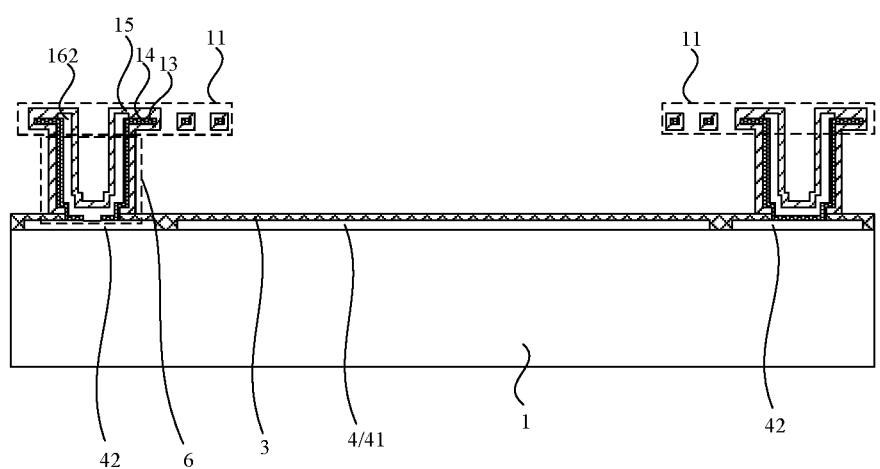
FIG. 27 is a schematic cross-sectional structural diagram of another infrared detector pixel provided by the embodiments of the present disclosure.

FIG. 26 is a schematic cross-sectional structural diagram of another infrared detector pixel provided by the embodiments of the present disclosure. FIG. 26 only shows the first columnar structure 61 and part of the beam structure 11 by way of example, and does not show a structure above the beam structure 11. As shown in FIG. 26, the infrared detector may also include a reinforcing structure 162. The reinforcing structure 162 is arranged corresponding to a position where the first columnar structure 61 is located. When the first columnar structure 61 is a hollow columnar structure, the reinforcing structure 162 is configured to enhance a connection stability between the first columnar structure 61 and the beam structure 11 and a connection stability between the first columnar structure 61 and the reflecting layer 4, i.e., to enhance a connection stability between the first columnar structure 61 and the support base 42. Exemplarily, the first reinforcing structure 162 corresponding to the hollow first columnar structure 62 may be located at one side of the first electrode layer 14 away from the CMOS measuring circuit system 1. When the dielectric layer is not covered above the first electrode layer 14, the first reinforcing structure 162 is located above the first electrode layer 14 and is in contact with the first electrode layer 14. In this case, the first reinforcing structure 162 corresponding to the hollow first columnar structure 61 may form a hollow structure or form a solid structure in the hollow columnar structure. When the dielectric layer is covered above the first electrode layer 14, for example, when the second dielectric layer 15 is covered above the first electrode layer 14 in FIG. 26, the first reinforcing structure 162 corresponding to the hollow first columnar structure 61 may be located above the second dielectric layer 15 and is in contact with the second dielectric layer 15. In this case, the first reinforcing structure 162 corresponding to the hollow first columnar structure 61 may form a hollow structure in the hollow columnar structure as shown in FIG. 26, and the first reinforcing structure 162 may also form a solid structure in the hollow columnar structure, that is, the first reinforcing structure 162 may also fill in an internal space formed by the second dielectric layer 15. Optionally, as shown in FIG. 27, the first reinforcing structure 162 may be disposed above the first electrode layer 14 and the first reinforcing structure 162 is in contact with the first electrode layer 14, that is, the first reinforcing structure 162 is located between the first electrode layer 14 and the second dielectric layer 15. In this case, the first reinforcing structure 162 forms a hollow structure in the hollow columnar structure.

Figure 28:
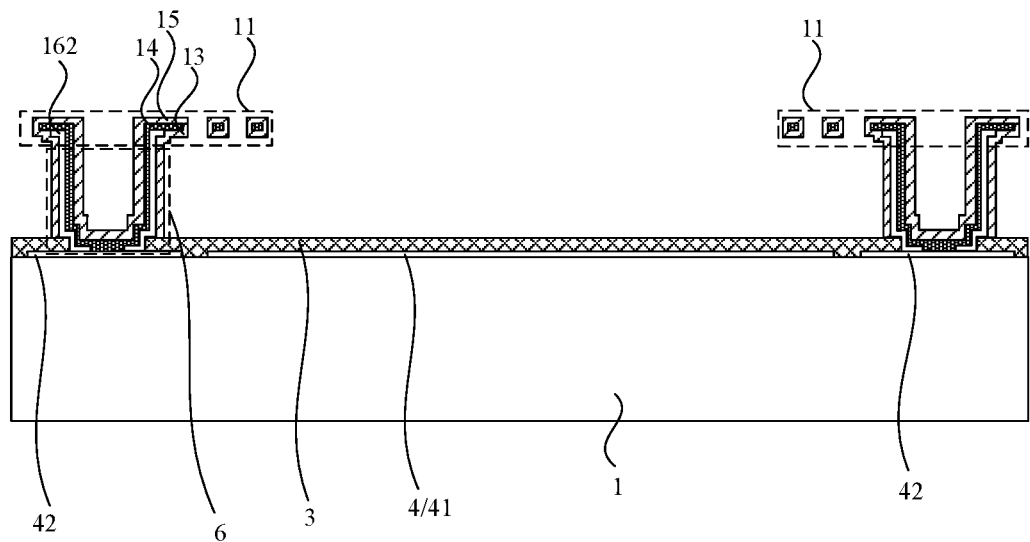
FIG. 28 is a schematic cross-sectional structural diagram of another infrared detector pixel provided by the embodiments of the present disclosure.

FIG. 28 is a schematic cross-sectional structural diagram of another infrared detector pixel provided by the embodiments of the present disclosure. FIG. 28 also only shows the first columnar structure 61 and part of the beam structure 11 by way of example and does not show the structure above the beam structure 11. As shown in FIG. 28, the first reinforcing structure 162 corresponding to the hollow first columnar structure 61 may be located at one side of the first electrode layer 14 close to the CMOS measuring circuit system 1. When the dielectric layer, for example, the first dielectric layer 13 is arranged below the first electrode layer 14, the first reinforcing structure 162 corresponding to the hollow first columnar structure 61 may be located between the first electrode layer 14 and the first dielectric layer 13, and the reinforcing structure 162 is in contact with the first electrode layer 14.

Referring to FIGS. 26, 27, and 28, no matter the first reinforcing structure 162 is located at one side of the first electrode layer 14 away from the CMOS measuring circuit system 1, or the first reinforcing structure 162 is located at one side of the first electrode layer 14 close to the CMOS measuring circuit system 1, the first reinforcing structure 162 covers a connection position of the first columnar structure 61 and the beam structure 11, which is equivalent to adding a weight block at the connection position between the first columnar structure 61 and the beam structure 11, thus enhancing the connection stability between the first columnar structure 61 and the beam structure 11 by using the first reinforcing structure 162. In addition, the first reinforcing structure 162 also covers at least part of the connection position between the first columnar structure 61 and the support base 42, which is equivalent to adding a weight block at the connection position between the first columnar structure 61 and the support base 42, so that the connection stability between the first columnar structure 6 and the support base 42 is enhanced by using the first reinforcing structure 162 corresponding to the hollow first columnar structure 61, thereby optimizing electrical connection characteristics of the whole infrared detector and optimizing the infrared detection performance of the infrared detector. For example, a material forming the first reinforcing structure 162 corresponding to the hollow first columnar structure 61 may be configured to include at least one of amorphous silicon, amorphous germanium, amorphous silicon-germanium, amorphous carbon, silicon carbide, aluminum oxide, silicon nitride, silicon carbonitride, silicon, germanium, germanium-silicon, aluminum, copper, wolfram, gold, platinum, nickel, chromium, titanium-tungsten alloy, nickel-chromium alloy, nickel-platinum alloy or nickel-silicon alloy. The first reinforcing structure 162 corresponding to the hollow first columnar structure 61 according to the above embodiments may be a metal structure, or a metalloid structure, which is not specifically limited in the embodiments of the present disclosure, as long as the arrangement of the first reinforcing structure 162 corresponding to the hollow first columnar structure 61 does not affect an electrical connection relationship in the infrared detector.

Optionally, in combination with FIGS. 2 and 7, the second columnar structure 62 may be configured to include at least one layer of hollow columnar structure. FIG. 2 and FIG. 7 exemplarily provide that the second columnar structure 62 includes one layer of hollow columnar structure. At least an electrode layer 14 is arranged in the hollow columnar structure. For the condition that the beam structure 11 shown in FIG. 2 and FIG. 7 is located at one side of the absorption plate 10 away from the CMOS measuring circuit system 1, at least the second electrode layer 140 is arranged in the second columnar structure 62. For the condition that the beam structure 11 shown in FIG. 5 is located at one side of the absorption plate 10 away from the CMOS measuring circuit system 1, at least the first electrode layer 14 is arranged in the second columnar structure 62. FIG. 2 and FIG. 7 exemplarily provide that the hollow columnar structure forming the second columnar structure 62 is provided with the second electrode layer 140 and the dielectric layers located at both sides of the second electrode layer 140, which effectively protect the second electrode layer 140, prevent the second electrode layer 140 from being oxidized or corroded, and optimize electric transmission characteristics of the infrared detector. Exemplarily, the dielectric layer located below the second electrode layer 140 in the 62, for example, maybe the third dielectric layer 130 in the absorption plate 10, and the dielectric layer located above the second electrode layer 140, for example, maybe the fourth dielectric layer 150 in the absorption plate 10. The dielectric layers at both sides of the second electrode layer 140 may also be separately manufactured film layers. In addition, it may be arranged that in the second columnar structure 62, no dielectric layer is arranged above and/or below the second electrode layer 140, that is, it may be arranged that the dielectric layer is only arranged below the second electrode layer 140 or above the second electrode layer 140 in the hollow columnar structure, or only the second electrode layer 140 is only arranged in the hollow columnar structure, and the outside of the second electrode layer 140 is not coated with the dielectric layer.

Optionally, by analogy with the arrangement of the first reinforcing structure 161 corresponding to the first columnar structure 61 in the structures shown in FIG. 26, FIG. 27 and FIG. 28, the infrared detector is configured to further include a second reinforcing structure, the second reinforcing structure is disposed corresponding to a position of the second columnar structure 62. When the beam structure 11 is located at one side of the absorption plate 10 close to the CMOS measuring circuit system 1, the second reinforcing structure is configured to enhance the connection stability between the second columnar structure 62 and the absorption plate 10. When the beam structure 11 is located at one side of the absorption plate 10 away from the CMOS measuring circuit system 1 similar to FIG. 5, the second reinforcing structure is configured to enhance the connection stability between the second columnar structure 62 and the absorption plate 10 and the connection stability between the second columnar structure 62 and the beam structure 11.

Optionally, the second reinforcing structure corresponding to the hollow second columnar structure 62 may be located at one side of the electrode layer away from the CMOS measuring circuit system 1. Optionally, the second reinforcing structure corresponding to the hollow second columnar structure 62 may be located at one side of the electrode layer close to the CMOS measuring circuit system 1. By analogy with the arrangement of the first reinforcing structure 161 corresponding to the first columnar structure 61 in the structure shown in FIG. 26, when the beam structure 11 is located at one side of the absorption plate 10 close to the CMOS measuring circuit system 1, the second reinforcing structure forming the corresponding hollow second columnar structure 62 may be configured at one side of the second electrode layer 140 away from the CMOS measuring circuit system 1. When no dielectric layer is covered above the second electrode layer 140, the second reinforcing structure forming the corresponding hollow second columnar structure 62 is located above the second electrode layer 140 and is in contact with the second electrode layer 140. In this case, the second reinforcing structure forming the corresponding hollow second columnar structure 62 may form a hollow structure or form a solid structure in the hollow columnar structure. When the dielectric layer is covered above the second electrode layer 140, for example, the fourth dielectric layer 150 is covered above the second electrode layer 140 shown in FIG. 2, the second reinforcing structure corresponding to the hollow second columnar structure 62 may be arranged above the fourth dielectric layer 150 and in contact with the fourth dielectric layer 150 in a manner similar to that of the first reinforcing structure 161 shown in FIG. 26. In this case, the second reinforcing structure corresponding to the hollow second columnar structure 62 form a hollow structure in the hollow columnar structure similar to that shown in FIG. 26. The second reinforcing structure corresponding to the hollow second columnar structure 62 may also form a solid structure in the hollow columnar structure, that is, the second reinforcing structure corresponding to the hollow second columnar structure 62 may also fill in an internal space enclosed by the fourth dielectric layer 150.

Optionally, similar to the arrangement of the first reinforcing structure 161 corresponding to the first columnar structure 61 in the structure shown in FIG. 27, the second reinforcing structure corresponding to the hollow second columnar structure 62 may be arranged above the second electrode layer 140 and in contact with the second electrode layer 140, that is, the second reinforcing structure corresponding to the hollow second columnar structure 62 is located between the second electrode layer 140 and the fourth dielectric layer 150. In this case, the second reinforcing structure corresponding to the hollow second columnar structure 62 forms a hollow structure in the hollow columnar structure.

Optionally, similar to the arrangement of the first reinforcing structure 161 corresponding to the first columnar structure 61 in the structure shown in FIG. 28, when the second reinforcing structure corresponding to the hollow second columnar structure 62 is located at one side of the second electrode layer 140 close to the CMOS measuring circuit system 1, and the dielectric layer (for example, the third dielectric layer 130) is arranged below the second electrode layer 140, the second reinforcing structure corresponding to the hollow second columnar structure 62 may be located between the second electrode layer 140 and the third dielectric layer 130, and the second reinforcing structure corresponding to the hollow second columnar structure 62 is in contact with the second electrode layer 140. Moreover, when the beam structure 11 similar to FIG. 5 is located at one side of the absorption plate 10 away from the CMOS measuring circuit system 1, and the first columnar structure 61 or the second columnar structure 62 is a hollow columnar structure, the reinforcing structure similar to those shown in FIG. 26 to FIG. 28 may also be arranged with respect to each columnar structure.

Referring to FIGS. 26, 27, and 28, no matter the second reinforcing structure corresponding to the hollow second columnar structure 62 is located at one side of the second electrode layer 140 away from the CMOS measuring circuit system 1, or the second reinforcing structure corresponding to the hollow second columnar structure 62 is located at one side of the second electrode layer 140 close to the CMOS measuring circuit system 1, the second reinforcing structure corresponding to the hollow second columnar structure 62 covers a connection position of the second columnar structure 62 and the absorption plate 10, which is equivalent to adding a weight block at the connection position between the second columnar structure 62 and the absorption plate 10, thus enhancing the connection stability between the connection stability between the second columnar structure 62 and the absorption plate 10.

For example, the material forming the first reinforcing structure 162 corresponding to the hollow first columnar structure 61 may be configured to include at least one of amorphous silicon, amorphous germanium, amorphous silicon-germanium, amorphous carbon, silicon carbide, aluminum oxide, silicon nitride, silicon carbonitride, silicon, germanium, germanium-silicon, aluminum, copper, wolfram, gold, platinum, nickel, chromium, titanium-tungsten alloy, nickel-chromium alloy, nickel-platinum alloy or nickel-silicon alloy. The material forming the second reinforcing structure corresponding to the hollow second columnar structure 62 may be configured to include at least one of amorphous silicon, amorphous germanium, amorphous silicon-germanium, amorphous carbon, silicon carbide, aluminium oxide, silicon nitride, silicon carbonitride, silicon, germanium, germanium-silicon, aluminum, copper, wolfram, gold, platinum, nickel, chromium, titanium-tungsten alloy, nickel-chromium alloy, nickel-platinum alloy or nickel-silicon alloy. The first reinforcing structure 162 corresponding to the hollow first columnar structure 61 and the second reinforcing structure corresponding to the hollow second columnar structure 62 according to the above embodiments may be metal structures, or metalloid structures, which are not specifically limited in the embodiments of the present disclosure, as long as the arrangement of the first reinforcing structure 162 corresponding to the hollow first columnar structure 61 and the second reinforcing structure corresponding to the hollow second columnar structure 62 do not affect an electrical connection relationship in the infrared detector.

Optionally, with reference to FIG. 1 to FIG. 28, at least one patterned metal interconnect layer may be disposed between the reflecting layer 4 and the suspended microbridge structure 40, the patterned metal interconnect layer is located above or below the sealed release isolation layer 3 and electrically insulated from the reflecting layer 4, and the patterned metal interconnect layer is configured to adjust a resonant mode of the infrared detector. Specifically, a Bragg reflector is an optical device for enhancing and reflecting light of different wavelengths by using phase-length interference of reflected light of different interfaces and is composed of a plurality of ¼ wavelength reflectors to achieve efficient reflection of incident light with multiple wavelengths. In the embodiments of the present disclosure, at least one patterned metal interconnection layer is arranged between the reflecting layer 4 and the suspended microbridge structure 40. The at least one patterned metal interconnection layer, the reflecting layer 4 and the absorption plate 10 form a structure similar to a Bragg reflector. The arrangement of the at least one patterned metal interconnection layer is equivalent to changing a thickness of an overall resonant cavity medium composed of the reflecting layer 4 and the heat-sensitive dielectric layer in the absorption plate 10, so that the infrared detector pixels can form a plurality of resonant cavities with different dielectric thicknesses, and the infrared detector pixels can select light of different wavelengths to enhance reflection adjustment, thereby adjusting the resonant mode of the infrared detector by using the at least one patterned metal interconnection layer, thus improving the infrared absorption rate of the infrared detector, widening the infrared absorption spectral coverage of the infrared detector, and increasing the infrared absorption spectral coverage of the infrared detector.

Exemplarily, the at least one patterned metal interconnection layer may be arranged at one side of the sealed release isolation layer 3 away from the CMOS measuring circuit system 1 and/or the at least one patterned metal interconnection layer may be arranged at one side of the sealed release isolation layer 3 close to the CMOS measuring circuit system 1. Exemplarily, the patterned metal interconnection layer may be configured to include a plurality of metal repeating units arranged in an array, each metal repeating unit may include at least one of two diagonally arranged L-shaped patterned structures, a circular structure, a sector structure, an ellipsoidal structure, a circular ring structure, an open ring structure, or a polygonized structure, or the patterned metal interconnection layer may be configured to include a plurality of patterned hollow structures arranged in an array, and the patterned hollow structure may include at least one of a circular hollow structure, an open annular hollow structure or a polygonized hollow structure. The embodiments of the present disclosure do not limit the specific patterns included in the patterned metal interconnection layer.

Figure 29:
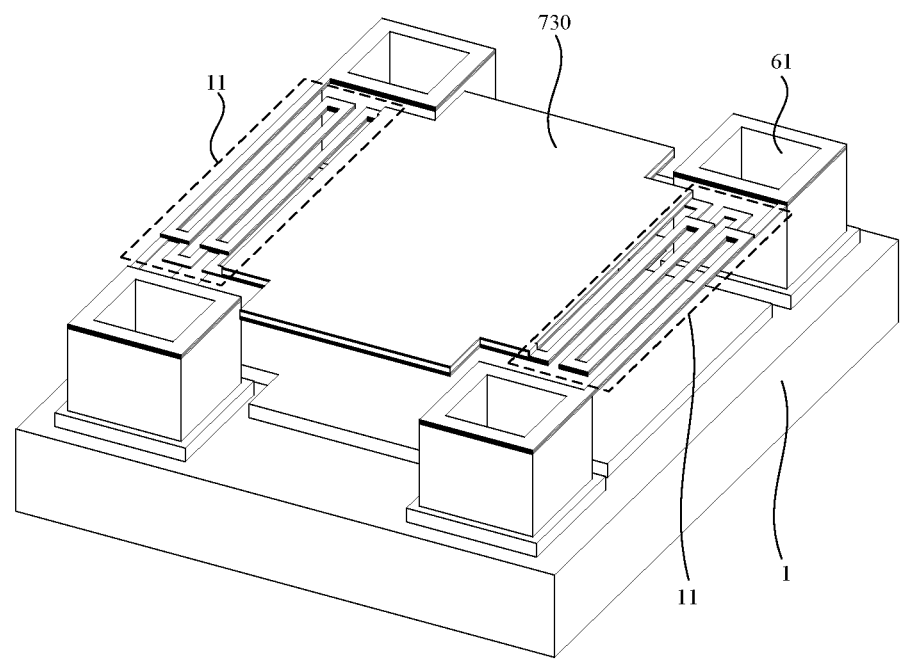
FIG. 29 is a schematic three-dimensional structure diagram of another infrared detector pixel provided by the embodiments of the present disclosure.
Figure 30:
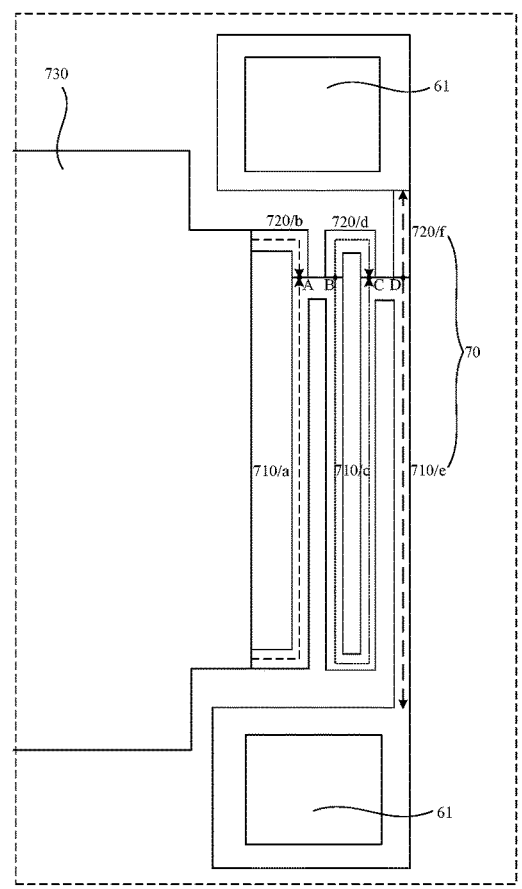
FIG. 30 is a schematic top view of the structure shown in FIG. 29.

FIG. 29 is a schematic three-dimensional structure diagram of another infrared detector pixel provided by the embodiments of the present disclosure, and FIG. 30 is a schematic top view of the structure shown in FIG. 29. FIG. 29 only illustrates the first columnar structure 61 and partial beam structure 11, but does not show the structure above the beam structure 11. In conjunction with FIG. 29 and FIG. 30, the beam structure 11 may be configured to include a thermal symmetric structure, that is, in a beam path from the absorption plate 10 or a middle portion 730 of the beam structure 11 to the corresponding first columnar structure 61, two parallel beam structures that meet at the same node are a first half-bridge structure 710 and a second half-bridge structure 720 respectively. The first half-bridge structure 710 and the second half-bridge structure 720 form thermal symmetric structure 70.

Heat of the infrared detector is conducted from the absorption plate 10 or the middle portion 730 of the beam structure 11 to the two first columnar structures 61 connecting the same beam structure 11. The first half-bridge structure 710 may include a support layer, an electrode layer and a passivating layer, for example, include the first dielectric layer 13, the first electrode layer 14 and the second dielectric layer 15. The second half-bridge structure 720 may include the first dielectric layer 13 and/or the second dielectric layer 15. That is, a thickness of the first half-bridge structure 710 is greater than a thickness of the second half-bridge structure 720. In the case that lengths of the first half-bridge structure 710 and the second half-bridge structure 720 are equal, a heat conduction speed of the first half-bridge structure 710 is faster than that of the second half-bridge structure 720 due to the greater thickness of the first half-bridge structure. According to the embodiments of the present disclosure, the lengths of the first half-bridge structure 710 and the second half-bridge structure 720 are asymmetrically designed, that is, the length of the first half-bridge structure 710 is set to be greater than the length of the second half-bridge structure 720, so that the heat conduction speed on the first half-bridge structure 710 with faster heat conduction speed caused by a thickness factor is slowed down. Further, an unbalanced thermal conductivity difference between the first half-bridge structure 710 and the second half-bridge structure 720 in thermal symmetric structure 70 is less than or equal to 20%, that is, a thermal conductivity speed difference between the first half-bridge structure 710 and the second half-bridge structure 720 in thermal symmetric structure 70 is less than or equal to 20%, and preferably, thermal conductivity of the first half-bridge structure 710 and thermal conductivity of the second half-bridge structure 720 in thermal symmetric structure 70 may be the same, thus further reducing the total thermal conductivity of the infrared detector, thereby improving the infrared detection performance of the infrared detector, reducing stress and deformation of the infrared detector under the same force, improving the stability and impact resistance of the infrared detector, and enhancing the mechanical strength of the infrared detector.

Specifically, in combination with FIG. 29 and FIG. 30, a parallel beam structure a and a parallel beam structure b intersect at the same node A, a parallel beam structure c and a parallel beam structure d intersect at nodes B and C, while a parallel beam structure e and a parallel beam structure f intersect at the same node D. In addition, the length of the first half-bridge structure 710 is longer than that of the second half-bridge structure 720 in thermal symmetric structure 70, so the parallel beam structure a is the first half-bridge structure 710 and the parallel beam structure b is the second half-bridge structure 720, and the two form one thermal symmetric structure 70. The parallel beam structure c is the first half-bridge structure 710 and the parallel beam structure d is the second half-bridge structure 720, and the two form one thermal symmetric structure 70. The parallel beam structure e is the first half-bridge structure 710 and the parallel beam structure f is the second half-bridge structure 720, and the two form one thermal symmetric structure 70.

Optionally, in combination with FIG. 2, FIG. 5, FIG. 6, FIG. 7, FIG. 8, FIG. 12 and FIG. 15, when the suspended micro-bridge structure 40 includes the first dielectric layer 13 and the second dielectric layer 15, the first dielectric layer 13 and/or the second dielectric layer 15 between the oppositely arranged beam structures 11 may be arranged to form a patterned film layer structure. The oppositely arranged beam structures 11 here are the beam structures 11 on left and right sides in FIG. 1 or the beam structures 11 on upper and lower sides in FIG. 1. The patterned film layer structure includes a plurality of strip-shaped patterns, and the strip-shaped patterns in the patterned film layer structure are arranged symmetrically relative to the beam structure 11.

Figure 31:
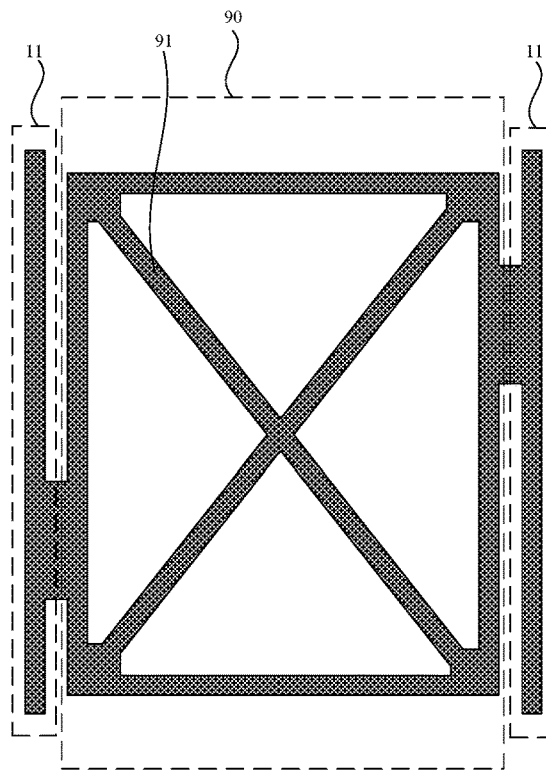
FIG. 31 is a schematic top view of a first dielectric layer provided by the embodiments of the present disclosure.

Taking the first dielectric layer 13 as an example, FIG. 31 is a schematic top view of one first dielectric layer provided by the embodiments of the present disclosure. In combination with FIG. 1 to FIG. 31, the first dielectric layer 13 between the oppositely arranged beam structures 11 may be configured to form the patterned film layer structure 90 as shown in FIG. 31. The patterned film layer structure 90 is located in an A1 area in FIG. 2, and the patterned film layer structure 90 includes a plurality of strip-shaped patterns 91. The strip-shaped patterns 91 in the patterned film layer structure 90 are symmetrically arranged relative to the beam structure 11, that is, the strip-shaped patterns 91 in the patterned film layer structure 90 are symmetrically arranged with respect to the beam structures 11 on left and right sides in FIG. 31. Therefore, the patterned film layer structure 90 is formed by arranging the first dielectric layer 13 and/or the second dielectric layer 15 between the two oppositely arranged beam structures 11, the patterned film layer structure 90 includes the plurality of strip-shaped patterns 91, and the strip-shaped patterns 91 in the patterned film layer structure 90 are symmetrically arranged relative to the beam structure 11, so that the mechanical stability of the patterned film layer structure 90 is effectively improved, and the mechanical stability of the whole infrared detector is further improved.

Moreover, it should be noted that the patterns in the patterned film layer structure 90 according to the embodiments of the present disclosure are not limited to the patterns shown in FIG. 31, for example, the patterned film layer structure 90 may further include more strip-shaped patterns to form a grid-shaped structure, and the like. The embodiments of the present disclosure do not limit the specific patterns in the patterned film layer structure 90 to ensure that the strip-shaped patterns in the patterned film layer structure 90 are symmetrical with respect to the beam structure 11, and the patterns in the patterned film layer structure 90 formed by the first dielectric layer 13 and the second dielectric layer 15 may be the same or different.

Optionally, the infrared detector may be configured to be based on 3 nm, 7 nm, 10 nm, 14 nm, 22 nm, 28 nm, 32 nm, 45 nm, 65 nm, 90 nm, 130 nm, 150 nm, 180 nm, 250 nm, or 350 nm CMOS process, and the foregoing sizes characterize process nodes of an integrated circuit, i.e. characterize feature sizes in an integrated circuit processing course.

Optionally, a metal wiring material forming the metal interconnection layer in the infrared detector may be configured to include at least one of aluminum, copper, tungsten, titanium, nickel, chromium, platinum, silver, ruthenium or cobalt, for example, a material forming the reflecting layer 4 may be configured to include at least one of aluminum, copper, tungsten, titanium, nickel, chromium, platinum, silver, ruthenium or cobalt. In addition, both the CMOS measuring circuit system 1 and the CMOS infrared sensing structure 2 are fabricated by using the CMOS process, and the CMOS infrared sensing structure 2 is directly fabricated on the CMOS measuring circuit system 1, so that radial side lengths of the first columnar structure 61 and the second columnar structure 62 are greater than or equal to 0.5 µm, less than or equal to 3 µm, and a width of the beam structure 11, that is, a width of a single line in the beam structure 11 is less than or equal to 0. 3 um, and a height of the resonant cavity is less than or equal to 2.5 um.

Moreover, it should be noted that, the embodiments of the present disclosure do not provide a schematic diagram of all structural infrared detectors belonging to the protection scope of the embodiments of the present disclosure and are not intended to limit the protection scope of the embodiments of the present disclosure. Different features disclosed in the embodiments of the present disclosure can be arbitrarily combined, for example, whether there is the first reinforcing structure and/or the second reinforcing structure in the infrared detector, both of the two features belong to the protection scope of the embodiments of the present disclosure, and any combination of the first columnar structure and the second columnar structure with different structures also belongs to the protection scope of the embodiments of the present disclosure.

It should be noted that relational terms herein such as "first", "second", and the like, are used merely to distinguish one entity or operation from another entity or operation, and do not necessarily require or imply there is any such relationship or order between these entities or operations. Furthermore, the terms "comprising", "including" or any variations thereof are intended to embrace a non-exclusive inclusion, such that a process, method, article, or device including a plurality of elements includes not only those elements but also includes other elements not expressly listed, or also incudes elements inherent to such a process, method, article, or device. In the absence of further limitation, an element defined by the phrase "including a . . . " does not exclude the presence of additional identical element in the process, method, article, or device.

The above are only specific embodiments of the present disclosure, so that those skilled in the art can understand or realize the present disclosure. Various modifications to these embodiments will be apparent to those skilled in the art, and the generic principles defined herein may be embodied in other embodiments without departing from the spirit or scope of the present disclosure. Therefore, the present disclosure will not to be limited to these embodiments shown herein, but is to be in conformity with the widest scope consistent with the principles and novel features disclosed herein.

INDUSTRIAL APPLICABILITY

The present invention is applicable to an infrared detector, realizes the integral preparation of the CMOS measuring circuit system and the CMOS infrared sensing structure on a CMOS production line by using the CMOS process, does not have a process compatibility problem, solves the technical difficulty faced by the MEMS process, is simple in preparation process and easy to control, can realize the multi-layer process design of the sacrificial layer, is beneficial to improving the degree of planarization of the film layer, and can realize the target of high yield, low cost, high productivity and large-scale integrated production of the chips, such that the infrared detector has high detection sensitivity, farther detection distance, better detection performances, is more beneficial to the miniaturization of the chip, has good product consistency, and has very strong industrial applicability.

The invention claimed is:

1. An infrared detector with a multi-layer structure based on a CMOS process, comprising:
    a CMOS measuring circuit system and a CMOS infrared sensing structure, wherein both the CMOS measuring circuit system and the CMOS infrared sensing structure are fabricated by using CMOS technology, and wherein the CMOS infrared sensing structure is directly fabricated on the CMOS measuring circuit system;
    wherein at least one sealed release isolation layer is arranged above the CMOS measuring circuit system, and the sealed release isolation layer is configured to protect the CMOS measuring circuit system from process influence in a release etching course of manufacturing the CMOS infrared sensing structure;
    wherein the CMOS manufacturing process for the CMOS infrared sensing structure comprises a metal interconnection process, a through hole process, an IMD process, and an RDL process, wherein the CMOS infrared sensing structure comprises at least three metal interconnection layers, at least three dielectric layers and a plurality of interconnection through holes, wherein the at least three metal interconnection layer comprises at least a reflecting layer and two electrode layers, and wherein the dielectric layer comprises at least two sacrificial layers and a heat-sensitive dielectric layer; wherein the heat-sensitive dielectric layer is configured to convert a temperature change corresponding to infrared radiation absorbed by the heat-sensitive dielectric layer into a resistance change, and then convert an infrared target signal into a signal which is electrically readable through the CMOS measuring circuit system;
    wherein the CMOS infrared sensing structure comprises a resonant cavity composed of the reflecting layer and the heat-sensitive dielectric layer and a suspended micro-bridge structure for controlling heat transfer, wherein the suspended micro-bridge structure comprises at least one layer of beam structure and at least one layer of absorption plate, the beam structure is located at one side of the absorption plate close to or away from the CMOS measuring circuit system, a first columnar structure is provided between the reflecting layer and the beam structure, wherein the first columnar structure is directly electrically connected to a support base in the reflecting layer and the corresponding beam structure, wherein the beam structure is electrically connected to the CMOS measuring circuit system through the first columnar structure and the support base, wherein a second columnar structure is provided between the absorption plate and the beam structure, wherein the second columnar structure is directly electrically connected to the corresponding absorption plate and the corresponding beam structure, and wherein the absorption plate is configured to convert an infrared signal into an electrical signal and electrically connect to the corresponding first columnar structure through the second columnar structure and the corresponding beam structure;

wherein the first columnar structure comprises at least one layer of solid columnar structure and/or at least one layer of hollow columnar structure, wherein the second columnar structure comprises at least one of a layer of solid columnar structure or a layer of hollow columnar structure;

wherein at least one hole-shaped structure is formed in the absorption plate, and the hole-shaped structure at least penetrates through a dielectric layer in the absorption plate; and/or, at least one hole-shaped structure is formed in the beam structure;

wherein the CMOS measuring circuit system is configured to measure and process a value of an array resistor formed by one or more CMOS infrared sensing structures, and convert the infrared signal into an image electrical signal; wherein the CMOS measuring circuit system comprises a bias generation circuit, a column-level analog front-end circuit, and a row-level circuit; wherein an input end of the bias generation circuit is connected to an output end of the row-level circuit, wherein an input end of the column-level analog front-end circuit is connected to an output end of the bias generation circuit, wherein the row-level circuit comprises a row-level mirror pixel and a row selection switch, wherein the column-level analog front-end circuit comprises a blind pixel; wherein the row-level circuit is distributed in each pixel and selects a signal to-be-processed according to a row strobe signal of a time sequence generation circuit, and outputs a current signal to the column-level analog front-end circuit to perform current and voltage conversion output under the action of the bias generation circuit; and wherein the row-level circuit outputs a third bias voltage to the bias generation circuit when the row-level circuit is strobed by the control of the row selection switch, wherein the bias generation circuit outputs a first bias voltage and a second bias voltage according to an input constant voltage and the third bias voltage, wherein the column-level analog front-end circuit obtains two paths of currents according to the first bias voltage and the second bias voltage, and performs transimpedance amplification on a difference between the generated two paths of currents and outputs the difference as an output voltage.

2. The infrared detector with the multi-layer structure based on the CMOS process according to claim 1, wherein the CMOS infrared sensing structure is fabricated in an upper layer or in the same layer of the metal interconnection layer of the CMOS measuring circuit system.

3. The infrared detector with the multi-layer structure based on the CMOS process according to claim 1, wherein the sacrificial layer is configured to enable the CMOS infrared sensing structure to form a hollow structure, and wherein a material forming the sacrificial layer is silicon oxide, and the sacrificial layer is corroded by using a post-CMOS process.

4. The infrared detector with the multi-layer structure based on the CMOS process according to claim 1, wherein the reflecting layer is configured to reflect the infrared signal and form the resonant cavity with the heat-sensitive dielectric layer, wherein the reflecting layer comprises at least one metal interconnection layer, the first columnar structure connects the corresponding beam structure and the CMOS measuring circuit system by using the metal interconnection process and the through hole process, and wherein the second columnar structure connects the corresponding absorption plate and the corresponding beam structure by using the metal interconnection process and the through hole process;

the beam structure comprises a first electrode layer, or the beam structure comprises a first dielectric layer and a first electrode layer, or the beam structure comprises a first electrode layer and a second dielectric layer, or the beam structure comprises a first electrode layer and a first heat-sensitive dielectric layer, or the beam structure comprises a first dielectric layer, a first electrode layer and a second dielectric layer, or the beam structure comprises a first dielectric layer, a first electrode layer and a first heat-sensitive dielectric layer, or the beam structure comprises a first electrode layer, a first heat-sensitive dielectric layer and a second dielectric layer, or the beam structure comprises a first dielectric layer, a first electrode layer, a first heat-sensitive dielectric layer and a second dielectric layer, and the absorption plate comprises a second electrode layer and a second heat-sensitive dielectric layer, or the absorption plate comprises a third dielectric layer, a second electrode layer and a second heat-sensitive dielectric layer, or the absorption plate comprises a second electrode layer, a second heat-sensitive dielectric layer and a fourth dielectric layer, or the absorption plate comprises a third dielectric layer, a second electrode layer, a second heat-sensitive dielectric layer and a fourth dielectric layer; wherein, a material forming the first dielectric layer comprises at least one of amorphous silicon, amorphous germanium, amorphous germanium-silicon, aluminum oxide or amorphous carbon, a material forming the second dielectric layer comprises at least one of amorphous silicon, amorphous germanium, amorphous germanium-silicon, aluminum oxide or amorphous carbon, a material forming the third dielectric layer comprises at least one of amorphous silicon, amorphous germanium, amorphous germanium-silicon, aluminum oxide or amorphous carbon, a material forming the fourth dielectric layer comprises at least one of amorphous silicon, amorphous germanium, amorphous germanium-silicon, aluminum oxide or amorphous carbon, a material forming the first heat-sensitive dielectric layer comprises at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum, and a material forming the second heat-sensitive dielectric layer comprises at least one of materials with temperature coefficient of resistance larger than a set value, which are fabricated from titanium oxide, vanadium oxide, amorphous silicon, amorphous germanium-silicon, amorphous germanium-oxygen-silicon, silicon, germanium, germanium-silicon, germanium-oxygen-silicon, graphene, barium strontium titanate film, copper or platinum; or, the beam structure comprises a first dielectric layer, a first electrode layer and a second dielectric layer, the absorption plate comprises a third dielectric layer and a second electrode layer, or the absorption plate comprises a second electrode layer and a fourth dielectric layer, or the absorption plate comprises a third dielectric layer, a second electrode layer and a fourth dielectric layer, or the absorption plate comprises a support layer, a third dielectric layer, a second electrode layer and a fourth dielectric layer, or the absorption plate comprises a third dielectric layer, a second electrode layer, a fourth dielectric layer and a passivating layer, or the absorption plate comprises a support layer, a third dielectric layer, a second electrode layer, a fourth dielectric layer and a passivating layer; wherein a material forming the first dielectric layer comprises at least one of materials with temperature coefficient of resistance larger than a set value, which are fabricated from amorphous silicon, amorphous germanium, amorphous germanium-silicon, or amorphous carbon, a material forming the second dielectric layer comprises at least one of materials with temperature coefficient of resistance larger than a set value, which are fabricated from amorphous silicon, amorphous germanium, amorphous germanium-silicon, or amorphous carbon, a material forming the third dielectric layer comprises at least one of materials with temperature coefficient of resistance larger than a set value, which are fabricated from amorphous silicon, amorphous germanium, amorphous germanium-silicon, or amorphous carbon, and a material forming the fourth dielectric layer comprises at least one of materials with temperature coefficient of resistance larger than a set value, which are fabricated from amorphous silicon, amorphous germanium, amorphous germanium-silicon, or amorphous carbon; and a material forming the first electrode layer comprises at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum or copper, and a material forming the second electrode layer comprises at least one of titanium, titanium nitride, tantalum, tantalum nitride, titanium-tungsten alloy, nickel-chromium alloy, nickel-platinum alloy, nickel-silicon alloy, nickel, chromium, platinum, tungsten, aluminum or copper.

5. The infrared detector with the multi-layer structure based on the CMOS process according to claim 4, wherein at least one patterned metal interconnection layer is provided between the reflecting layer and the suspended micro-bridge structure, the patterned metal interconnection layer is located above or below the sealed release isolation layer and electrically insulated from the reflecting layer, and the patterned metal interconnection layer is configured to adjust a resonant mode of the infrared detector; and the suspended micro-bridge structure comprises a third dielectric layer and a fourth dielectric layer, the infrared detector further comprises a metamaterial structure and/or a polarization structure, the metamaterial structure or the polarization structure is at least one metal interconnection layer on one side of the third dielectric layer close to the CMOS measuring circuit system, or at least one metal interconnection layer on one side of the fourth dielectric layer away from the CMOS measuring circuit system, or at least one metal interconnection layer between the third dielectric layer and the fourth dielectric layer and electrically insulated from the second electrode layer, or the second electrode layer is used as a metamaterial structure layer or a polarization structure layer.

6. The infrared detector with the multi-layer structure based on the CMOS process according to claim 4, wherein the first columnar structure comprises at least one layer of hollow columnar structure, and at least the first electrode layer is arranged in the hollow columnar structure;

the infrared detector further comprises a first reinforcing structure, the first reinforcing structure is arranged corresponding to a position of the first columnar structure, and the first reinforcing structure is configured to reinforce a connection stability between the first columnar structure and the beam structure and a connection stability between the first columnar structure and the reflecting layer; and the first reinforcing structure is located at one side of the first electrode layer away from the CMOS measuring circuit system; or the first reinforcing structure is located at one side of the first electrode layer close to the CMOS measuring circuit system.

7. The infrared detector with the multi-layer structure based on the CMOS process according to claim 4, wherein the second columnar structure comprises at least one layer of hollow columnar structure, and an electrode layer is arranged in the hollow columnar structure;

the infrared detector further comprises a second reinforcing structure, the second reinforcing structure is arranged corresponding to a position of the second columnar structure, and the second reinforcing structure is configured to reinforce a connection stability between the second columnar structure and the absorption plate; and the second reinforcing structure is located at one side of the electrode layer away from the CMOS measuring circuit system; or, the second reinforcing structure is located at one side of the electrode layer close to the CMOS measuring circuit system.

8. The infrared detector with the multi-layer structure based on the CMOS process according to claim 4, wherein the beam structure comprises a thermal symmetric structure; and the suspended micro-bridge structure comprises a first dielectric layer and a second dielectric layer, the first dielectric layer or the second dielectric layer between the oppositely arranged beam structures forms a patterned film layer structure, the patterned film layer structure comprises a plurality of strip-shaped patterns, and the strip-shaped patterns are symmetrically arranged relative to the beam structure.

9. The infrared detector with the multi-layer structure based on the CMOS process according to claim 1, wherein the first columnar structure comprises at least one layer of solid columnar structure, and the solid columnar structure comprises a solid structure;

a side wall of the solid structure is in contact with the sacrificial layer between the corresponding beam structure and the CMOS measuring circuit system, and a material forming the solid structure comprises at least one of tungsten, copper or aluminum; or, the side wall of the solid structure is coated with at least one dielectric layer, and the solid structure is arranged in contact with one dielectric layer, the material forming the solid structure comprises at least one of tungsten, copper or aluminum, and a material forming the dielectric layer comprises at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum; or, the side wall of the solid structure and a surface of the solid structure close to the CMOS measuring circuit system are coated with at least one adhesive layer, the adhesive layer at an outermost periphery in the first columnar structure is coated with a dielectric layer away from the side wall of the solid structure, the material forming the solid structure comprises at least one of tungsten, copper or aluminum, a material forming the adhesive layer comprises at least one of titanium, titanium nitride, tantalum or tantalum nitride, and a material forming the dielectric layer comprises at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum;

the infrared detector further comprises a first reinforcing structure, the first reinforcing structure is arranged corresponding to a position of the first columnar structure and located at one side of the first columnar structure away from the CMOS measuring circuit system, the first reinforcing structure is configured to reinforce a connection stability between the first columnar structure and the beam structure, and the reinforcing structure comprises a weighted block structure; and the weighted block structure is located at one side of the beam structure away from the CMOS measuring circuit system, and the weighted block structure is arranged in contact with the beam structure; or, the beam structure is formed with a through hole corresponding to the position of the first columnar structure, the through hole exposes at least part of the first columnar structure, the weighted block structure comprises a first portion filling the through hole and a second portion located outside the through hole, and an orthographic projection of the second portion covers an orthographic projection of the first portion.

10. The infrared detector with the multi-layer structure based on the CMOS process according to claim 1, wherein the second columnar structure comprises at least one layer of solid columnar structure, and the solid columnar structure comprises a solid structure;

a side wall of the solid structure is in contact with the sacrificial layer between the corresponding beam structure and the CMOS measuring circuit system, and a material forming the solid structure comprises at least one of tungsten, copper or aluminum; or, the side wall of the solid structure is coated with at least one dielectric layer, and the solid structure is arranged in contact with one dielectric layer, the material forming the solid structure comprises at least one of tungsten, copper or aluminum, and a material forming the dielectric layer comprises at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum; or, the side wall of the solid structure and a surface of the solid structure close to the CMOS measuring circuit system are coated with at least one adhesive layer, the adhesive layer at an outermost periphery in the second columnar structure is coated with a dielectric layer away from the side wall of the solid structure, the material forming the solid structure comprises at least one of tungsten, copper or aluminum, a material forming the adhesive layer comprises at least one of titanium, titanium nitride, tantalum or tantalum nitride, and a material forming the dielectric layer comprises at least one of silicon oxide, silicon nitride, silicon carbide, amorphous carbon, aluminum oxide, titanium oxide, vanadium oxide, amorphous silicon, amorphous germanium, amorphous germanium-silicon, amorphous germanium-oxygen-silicon, silicon, germanium, germanium-silicon, germanium-oxygen-silicon, graphene, copper or platinum;

the infrared detector further comprises a second reinforcing structure, the second reinforcing structure is arranged corresponding to a position of the second columnar structure and located at one side of the second columnar structure away from the CMOS measuring circuit system, the beam structure is located at one side of the absorption plate close to the CMOS measuring circuit system, the second reinforcing structure is configured to reinforce a connection stability between the second columnar structure and the absorption plate, and the reinforcing structure comprises a weighted block structure; and the weighted block structure is located at one side of the absorption plate away from the CMOS measuring circuit system, and the weighted block structure is arranged in contact with the absorption plate; or, the absorption plate is formed with a through hole corresponding to the position of the second columnar structure, the through hole exposes at least part of the second columnar structure, the weighted block structure comprises a first portion filling the through hole and a second portion located outside the through hole, and an orthographic projection of the second portion covers an orthographic projection of the first portion.

11. The infrared detector with the multi-layer structure based on the CMOS process according to claim 1, wherein the sealed release isolation layer is located on an interface between the CMOS measuring circuit system and the CMOS infrared sensing structure and/or located in the CMOS infrared sensing structure; and the sealed release isolation layer comprises at least one dielectric layer, and a dielectric material forming the sealed release isolation layer comprises at least one of silicon carbide, silicon carbonitride, silicon nitride, amorphous silicon, amorphous germanium, amorphous germanium-silicon, silicon, germanium, germanium-silicon, amorphous carbon or aluminum oxide.

12. The infrared detector with the multi-layer structure based on the CMOS process according to claim 1, wherein the infrared detector is based on 3 nm, 7 nm, 10 nm, 14 nm, 22 nm, 28 nm, 32 nm, 45 nm, 65 nm, 90 nm, 130 nm, 150 nm, 180 nm, 250 nm, or 350 nm CMOS process; and wherein a metal wiring material forming the metal interconnection layer comprises at least one of aluminum, copper, tungsten, titanium, nickel, chromium, platinum, silver, ruthenium, or cobalt.

* * * * *